US011626567B2

(12) United States Patent
Kim et al.

(10) Patent No.: US 11,626,567 B2
(45) Date of Patent: Apr. 11, 2023

(54) DISPLAY DEVICE

(71) Applicant: Samsung Display Co., Ltd., Yongin-si (KR)

(72) Inventors: Minseop Kim, Cheonan-si (KR); Hoseung Kang, Asan-si (KR); Hosung Nam, Seoul (KR); Joonhyuk Jang, Seoul (KR); Munsik Ham, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 93 days.

(21) Appl. No.: 17/220,510

(22) Filed: Apr. 1, 2021

(65) Prior Publication Data

US 2022/0059795 A1 Feb. 24, 2022

(30) Foreign Application Priority Data

Aug. 19, 2020 (KR) .................. 10-2020-0103871

(51) Int. Cl.
*H01L 51/52* (2006.01)
*H01L 27/32* (2006.01)

(52) U.S. Cl.
CPC .......... *H01L 51/52* (2013.01); *H01L 27/3276* (2013.01); *H01L 27/323* (2013.01); *H01L 51/529* (2013.01); *H01L 51/5253* (2013.01); *H01L 2251/5338* (2013.01)

(58) Field of Classification Search
CPC ... H01L 51/52; H01L 27/3276; H01L 27/323; H01L 51/5253; H01L 51/529; H01L 2251/5338; H01L 51/0097; H01L 23/60; H01L 51/0012; H01L 51/56; Y02E 10/549; G09F 9/301
See application file for complete search history.

(56) References Cited

U.S. PATENT DOCUMENTS

| 6,649,509 | B1 | 11/2003 | Lin et al. |
| 9,276,055 | B1 * | 3/2016 | Son ..................... H01L 27/323 |
| 10,796,633 | B2 | 10/2020 | Ahn et al. |
| 2020/0227504 | A1 | 7/2020 | Luo et al. |

FOREIGN PATENT DOCUMENTS

| CN | 108615749 B | 4/2020 |
| KR | 10-2019-0007578 A | 1/2019 |
| KR | 10-2019122 B1 | 9/2019 |

* cited by examiner

*Primary Examiner* — Kyoung Lee
(74) *Attorney, Agent, or Firm* — Lewis Roca Rothgerber Christie LLP

(57) ABSTRACT

A display device includes: a display panel in which a first panel region, a bending region, and a second panel region are arranged along a first direction; a support layer below the first panel region of the display panel, wherein the bending region of the display panel is bent toward a lower portion of the support layer; a portion of the support layer is between the first panel region and the second panel region; a first alignment mark in the first panel region; and a first alignment opening overlapping the first alignment mark in the support layer, wherein in a thickness direction of the display panel, the first alignment opening is spaced apart from the second panel region, the first alignment opening is spaced apart from an edge of the support layer, and the first alignment opening is completely surrounded by the support layer.

20 Claims, 15 Drawing Sheets

DISPLAY DEVICE

CROSS-REFERENCE TO RELATED APPLICATIONS

This application claims priority to and the benefit of Korean Patent Application No. 10-2020-0103871, filed on Aug. 19, 2020, the entire contents of which are hereby incorporated by reference.

BACKGROUND

Aspects of some embodiments of the present disclosure herein relate to a display device with relatively enhanced product reliability.

A display device displays various images on a display screen to provide information to a user. In general, a display device displays information within an assigned screen. Recently, flexible display devices including a foldable flexible display panel have been developed. Unlike rigid display devices, flexible display devices are generally designed to be folded, rolled, or bent without breaking or damaging the display device. A flexible display device in which the shape may be changed in various ways is portable without being limited to the existing screen size, and thus a user convenience and experience may be improved.

The above information disclosed in this Background section is only for enhancement of understanding of the background and therefore the information discussed in this Background section does not necessarily constitute prior art.

SUMMARY

Aspects of some embodiments of the present disclosure include a display device with relatively improved product reliability.

According to some embodiments of the inventive concept, a display device includes a display panel in which a first panel region, a bending region, and a second panel region are defined along a first direction; and a support layer below the first panel region of the display panel, wherein the bending region of the display panel may be bent toward a lower portion of the support layer, a portion of the support layer may be between the first panel region and the second panel region, the display panel may include a first alignment mark in the first panel region, a first alignment opening overlapping the first alignment mark may be defined in the support layer, in a thickness direction of the display panel, the first alignment opening may be spaced apart from the second panel region, the first alignment opening may be spaced apart from an edge of the support layer, and the first alignment opening may be completely surrounded by the support layer.

According to some embodiments, in the thickness direction, the first alignment opening may be spaced apart from the second panel region in a second direction intersecting the first direction.

According to some embodiments, the first alignment opening may be provided in plurality, and the plurality of first alignment openings may be spaced apart with the second panel region interposed therebetween.

According to some embodiments, the first alignment mark may be provided in plurality, and the display panel may be aligned with the support layer so that the plurality of first alignment marks respectively overlap the plurality of first alignment openings.

According to some embodiments, the support layer may include a first edge and a second edge which extend along the first direction, and a third edge and a fourth edge which extend along a second direction intersecting the first direction, wherein the bending region may be bent while surrounding the fourth edge, and the first alignment opening may be closest to the fourth edge among the first to the fourth edges.

According to some embodiments, the display panel may further include a second alignment mark in the first panel region, wherein a second alignment opening overlapping the second alignment mark may be defined in the support layer, and the second alignment opening may be closest to the first edge among the first to the fourth edges.

According to some embodiments, the second alignment opening may be spaced apart from the first edge and the second alignment opening may be completely surrounded by the support layer.

According to some embodiments, the second alignment opening may be connected to the first edge, and the first edge and a sidewall defining the second alignment opening may be connected to each other.

According to some embodiments, a foldable region may be defined in the first panel region and a plurality of openings may be defined in a region of the support layer overlapping the foldable region.

According to some embodiments, the first alignment opening may be spaced apart from the plurality of openings in the first direction.

According to some embodiments, the display panel may include: a base layer; a circuit layer on the base layer and including a plurality of metal layers; a light emitting element layer on the circuit layer; and an encapsulating layer on the light emitting element layer; wherein the first alignment mark may be on the same layer as any one of the plurality of metal layers.

According to some embodiments, a sidewall defining the first alignment opening may have a closed curve shape.

According to some embodiments of the inventive concept, a display device includes: a display panel in which a first panel region, a bending region, and a second panel region are defined along a first direction; and a support layer below the first panel region of the display panel, wherein the bending region of the display panel may be bent toward a lower portion of the support layer, a portion of the support layer may be between the first panel region and the second panel region, a plurality of alignment openings may be defined in the support layer, a distance of the plurality of alignment openings in a second direction intersecting the first direction is greater than a width of the second panel region in a second direction, and each of the plurality of alignment openings may be completely surrounded by the support layer.

According to some embodiments, the plurality of alignment openings may be defined to be spaced apart with the second panel region interposed therebetween.

According to some embodiments, sidewalls respectively defining the plurality of alignment openings may be defined in the support layer. Each of the sidewalls may have a closed curve shape.

According to some embodiments, the display panel may include a plurality of alignment marks in the first panel region, and the plurality of alignment marks may respectively overlap the plurality of alignment openings.

According to some embodiments, the display panel may further include: a base layer; a circuit layer on the base layer and including a plurality of metal layers; a light emitting element layer on the circuit layer; and an encapsulating layer on the light emitting element layer; and each of the plurality of alignment marks may be on the same layer as any one of the plurality of metal layers.

According to some embodiments, the plurality of alignment openings may be defined adjacent to an edge of the support layer, and the bending region of the display panel may be bent while surrounding the edge of the support layer.

According to some embodiments, a foldable region may be defined in the first panel region and a plurality of openings may be defined in a region of the support layer overlapping the foldable region of the display panel.

According to some embodiments, the plurality of alignment openings may be spaced apart from the plurality of openings in the first direction.

BRIEF DESCRIPTION OF THE FIGURES

The accompanying drawings are included to provide a further understanding of embodiments according to the inventive concept, and are incorporated in and constitute a part of this specification. The drawings illustrate aspects of some embodiments of the inventive concept and, together with the description, serve to explain principles of embodiments according to the inventive concept. In the drawings.

DETAILED DESCRIPTION

Figure 1A:
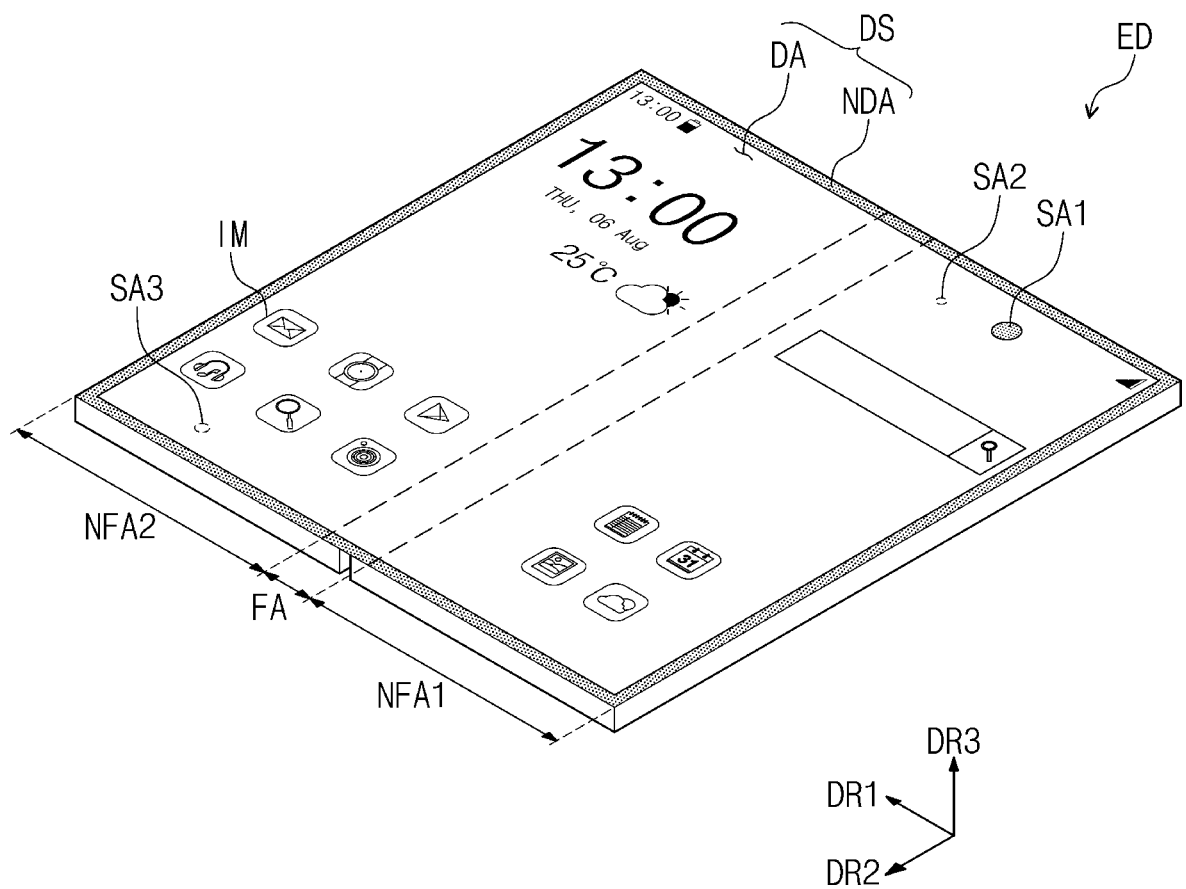
FIGS. 1A and 1B are perspective views of an electronic device according to some embodiments of the inventive concept.

It will be understood that when an element (or region, layer, part, etc.) is referred to as being "on", "connected to", or "coupled to" another element, it can be directly on, connected or coupled to the other element or a third intervening elements may be present.

Like reference numerals refer to like elements throughout this specification. In addition, in the figures, thicknesses, ratios, and dimensions of components are exaggerated for effective description of the technical contents. The term "and/or" includes any and all of one or more combinations which may be defined by associated components.

It will be understood that, although the terms first, second, etc. may be used herein to describe various components, these components should not be limited by these terms. These terms are only used to distinguish one component from another component. For example, a first component may be termed a second component without departing from the scope of the present invention, and similarly, a second component may be termed a first component. The singular forms, "a", "an" and "the" are intended to include the plural forms as well, unless the context clearly indicates otherwise.

In addition, the spatially relative terms, such as "below", "lower", "on", "upper" and the like are used herein to describe one component or feature's relationship to another component illustrated in the figures. The terms are the spatially relative descriptors and described based on the direction shown in the figures.

It will be further understood that the terms "include" or "have" etc., when used in this specification, specify the presence of stated features, integers, steps, operations, components, or parts, but do not preclude the presence or addition of one or more other features, integers, steps, operations, components, parts, or combination thereof.

Unless otherwise defined, all terms (including technical and scientific terms) used herein have the same meaning as commonly understood by one of ordinary skill in the art to which this invention belongs. In addition, the terms, such as those defined in commonly used dictionaries, should be interpreted as having a meaning that is consistent with their meaning in the context of the relevant art and will not be interpreted in an idealized or overly formal sense unless expressly so defined herein.

Hereinafter, aspects of some embodiments of the present invention will be explained in more detail with reference to the accompanying drawings.

Figure 1B:
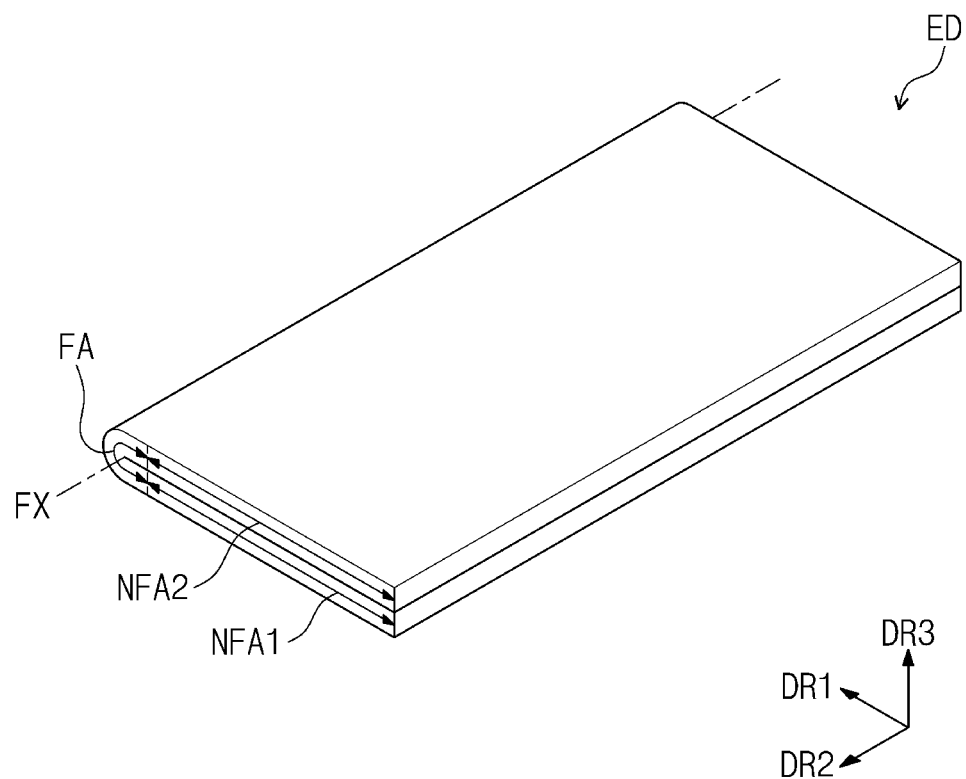

FIGS. 1A and 1B are perspective views of an electronic device ED according to some embodiments of the inventive concept. FIG. 1A illustrates a flat state (or unfolded state) of an electronic device ED, and FIG. 1B illustrates a folded state of the electronic device ED.

Referring to FIGS. 1A and 1B, an electronic device ED according to some embodiments of the inventive concept may include a display surface DS defined by a first direction DR1 and a second direction DR2 intersecting the first direction DR1. That is, the display surface, when the electronic device ED is in an unfolded or flat state or configuration, may be a plane that is parallel to a plane defined by the first direction DR1 and the second direction DR2. The electronic device ED may provide an image IM to a user through the display surface DS.

The display surface DS may include a display region DA and a non-display region NDA around the display region DA. The display region DA may display an image IM, and the non-display region NDA may not display an image IM. The non-display region NDA may surround the display region DA. However, embodiments of the inventive concept are not limited thereto, and the shape of the display region DA and the shape of the non-display region NDA may be varied.

Hereinafter, a direction substantially perpendicular to a plane defined by the first direction DR1 and the second direction DR2 is defined as a third direction DR3. In addition, "on a plane" as used herein may be defined as a state viewed from the third direction DR3. Also, "in the thickness direction" may be defined as a state viewed from the third direction DR3. Hereinafter, the first to the third directions DR1 to DR3 respectively refer to the same reference designations as directions indicated by the first to the third direction axes.

The electronic device ED may include a foldable region FA and a plurality of non-folding regions NFA1 and NFA2. The non-folding regions NFA1 and NFA2 may include a first non-folding region NFA1 and a second non-folding region NFA2. In the first direction DR1, the foldable region FA may be located between the first non-folding region NFA1 and the second non-folding region NFA2. The foldable region FA may be referred to as a first region FA, the first non-folding region NFA1 may be referred to as a second region NFA1, and the second non-folding region NFA2 may be referred to as a third region NFA2.

As illustrated in the FIG. 1B, the foldable region FA may be folded around a folding axis FX parallel to the second direction DR2. The foldable region FA has a certain curvature and a radius of curvature. The first non-folding region NFA1 and the second non-folding region NFA2 may face each other, and the electronic device ED may be inner-folded so that the display surface DS is not exposed to the outside.

According to some embodiments of the inventive concept, an electronic device ED may be outer-folded so that the display surface DS is exposed to the outside. According to some embodiments of the inventive concept, an electronic device ED may be configured to interchangeably repeat an inner-folding or an outer-folding operation from an unfolding operation, but embodiments of the inventive concept are not limited thereto. According to some embodiments of the inventive concept, an electronic device ED may be configured to select any one of an unfolding operation, an inner-folding operation, or outer-folding operation.

A plurality of sensing regions SA1, SA2, and SA3 may be defined in an electronic device ED. In FIG. 1A, three sensing regions SA1, SA2, and SA3 are illustrated by way of examples, but the number of sensing regions SA1, SA2, and SA3 is not limited thereto.

The sensing regions SA1, SA2, and SA3 may include a first sensing region SA1, a second sensing region SA2, and a third sensing region SA3. For example, the first sensing region SA1 may overlap a camera module, the second sensing region SA2 may overlap a first illuminance sensor, and the third sensing region SA3 may overlap a second illuminance sensor, but embodiments of the inventive concept are not particularly limited thereto.

Electronic modules (for example, a camera module, a first illuminance sensor, or a second illuminance sensor) may receive an external input transmitted through each of the first to the third sensing regions SA1, SA2, and SA3, or may provide an output through each of the first to the third sensing regions SA1, SA2, and SA3.

The first sensing region SA1 may be surrounded by the display region DA, and each of the second sensing region SA2 and the third sensing region SA3 may be included in the display region DA. That is, the second sensing region SA2 and the third sensing region SA3 may display an image. The transmittance of each of the first to the third sensing regions SA1, SA2, and SA3 may be higher than that of the display region DA. Further, the transmittance of the first sensing region SA1 may be higher than each of the transmittance of the second sensing region SA2, and the transmittance of the third sensing region SA3.

According to some embodiments of the inventive concept, a camera module may be surrounded by the display region DA, and each of the first and the second illuminance sensors may overlap the display region DA. Accordingly, a region where the camera module, the first illuminance sensor, and the second illuminance sensor are being arranged may not be provided in the non-display region NDA. As a result, a ratio of an area of the display region DA to an area of the front surface of the electronic device ED may be increased.

Figure 2:
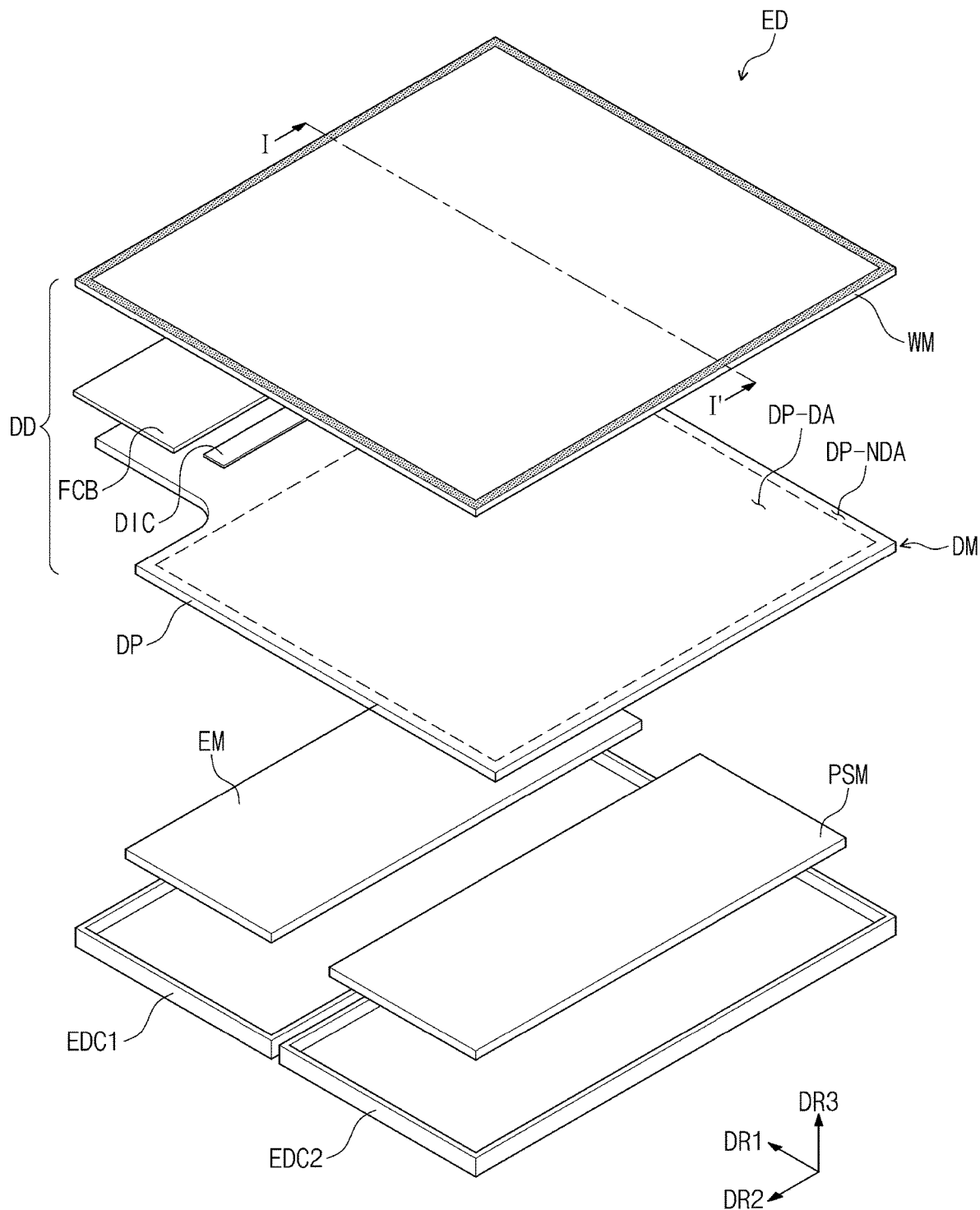
FIG. 2 is an exploded perspective view of an electronic device according to some embodiments of the inventive concept.

FIG. 2 is an exploded perspective view of an electronic device according to some embodiments of the inventive concept.

Referring to FIG. 2, an electronic device ED may include a display device DD, an electronic module EM, a power supply module PSM and cases EDC1 and EDC2. According to some embodiments, the electronic device ED may further include a mechanical structure to control a folding operation of the display device DD.

The display device DD generates an image and senses an external input. The display device DD includes a window module WM and a display module DM. The window module WM provides a front surface of the electronic device ED.

The display module DM may include at least a display panel DP. In FIG. 2, the display module DM is illustrated to be the same as the display panel DP, but substantially, the display module DM may have a stack structure in which a plurality of components are stacked. A detailed description of the stack structure of the display module DM will be described further below.

The display panel DP includes a display region DP-DA and a non-display region DP-NDA respectively corresponding to the display region DA (see FIG. 1A) and the non-display region NDA (see FIG. 1A) of the electronic device ED. In this specification "a region/a portion corresponds to another region/another portion" means a case in which the regions/portions overlap each other, but is not limited to a case in which the regions/portions have the same area. The display module DM may include a driving chip DIC located on the non-display region DP-NDA. The display module DM may further include a flexible printed circuit film FCB coupled to the non-display region DP-NDA.

The driving chip DIC may include driving elements for driving pixels of the display panel DP, for example, data driving circuits. FIG. 2 illustrates a structure in which the driving chip DIC is mounted on the display panel DP, but embodiments of the inventive concept are not limited thereto. For example, the driving chip DIC may be mounted on the flexible printed circuit film FCB.

The electronic module EM includes at least a main controller. The electronic module EM may include a wireless communication module, a camera module, a proximity sensor module, an image input module, an acoustic input module, an acoustic output module, a memory, an external interface module, and the like. The electronic module EM is electrically connected to the power supply module PSM.

The main controller controls overall operation of the electronic device ED. For example, the main controller activates or inactivates the display device DD according to a user input. The main controller may control the operation of the display device DD and other modules. The main controller may include at least one microprocessor.

The cases EDC1 and EDC2 accommodate the display module DM, the electronic module EM, and the power supply module PSM. Two separated cases EDC1 and EDC2 are illustrated by way of example, but embodiments of the inventive concept are not limited thereto. According to some embodiments, the electronic device ED may further include a hinge structure for connecting the two cases EDC1 and EDC2. These cases EDC1 and EDC2 may be coupled to the window module WM. The cases EDC1 and EDC2 protect components accommodated in the cases EDC1 and EDC2, such as the display module DM, the electronic module EM, and the power supply module PSM.

Figure 3:
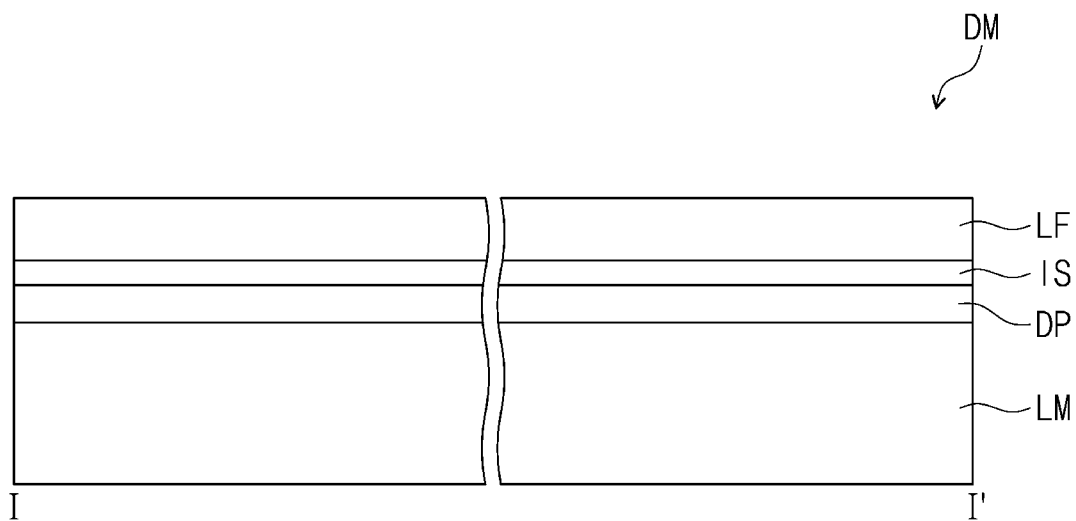
FIG. 3 is a cross-sectional view of a display module according to some embodiments of the inventive concept.
Figure 3:
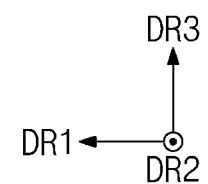

FIG. 3 is a cross-sectional view of a display module according to some embodiments of the inventive concept.

Referring to FIG. 3, a display module DM may include a display panel DP, an input sensor IS located on the display panel DP, an optical film LF located on the input sensor IS, and a lower member LM located below the display panel DP. An adhesive layer may be located between the members as needed.

The display panel DP may include a base layer, a circuit element layer located on the base layer, a display element layer located on the circuit element layer, and a thin film encapsulating layer located on the display element layer. The base layer may include a plastic film. For example, the base layer may include polyimide. Substantially, a planar shape of the base layer may be the same as a planar shape of a display panel DP illustrated in FIG. 4 to be described below.

The circuit element layer may include an organic layer, an inorganic layer, a semiconductor pattern, a conductive pattern, a signal line, and the like. By a method such as coating and deposition, the organic layer, the inorganic layer, the semiconductor layer, and the conductive layer may be formed on the base layer. Then, the organic layer, the inorganic layer, the semiconductor layer, and the conductive layer may be selectively patterned through several times of photolithographic processes to form a semiconductor pattern, a conductive pattern, and a signal line.

The semiconductor pattern, the conductive pattern, and the signal line may form a pixel driving circuit and signal lines SL1-SLm, DL1-DLn, EL1-ELm, CSL1, CSL2 and PL of the pixels PX illustrated in FIG. 4 to be described below. The pixel driving circuit may include at least one transistor.

The display element layer includes light emitting elements for the pixels PX illustrated in FIG. 4 to be described below. The light emitting elements each are electrically connected to the at least one transistor. The thin film encapsulating layer may be located on the circuit element layer to seal the display element layer. The thin film encapsulating layer may include an inorganic layer, an organic layer, and an inorganic layer sequentially stacked. The stack structure of the thin film encapsulating layer is not particularly limited.

The input sensor IS may include a plurality of sensing electrodes for sensing an external input, trace lines connected to the plurality of sensing electrodes, and an inorganic layer and/or an organic layer for insulating/protecting the plurality of sensing electrodes or trace lines. The input sensor IS may be a capacitive sensor, but is not particularly limited.

When manufacturing the display panel DP, the input sensor IS may be directly formed on the thin film encapsulating layer through a continuous process. In this specification, an input sensor IS integrated display panel DP may be defined as an electronic panel. However, embodiments of the inventive concept are not limited thereto, and the input sensor IS may be manufactured as a separate panel from the display panel DP and attached to the display panel DP by an adhesive layer.

Figure 4:
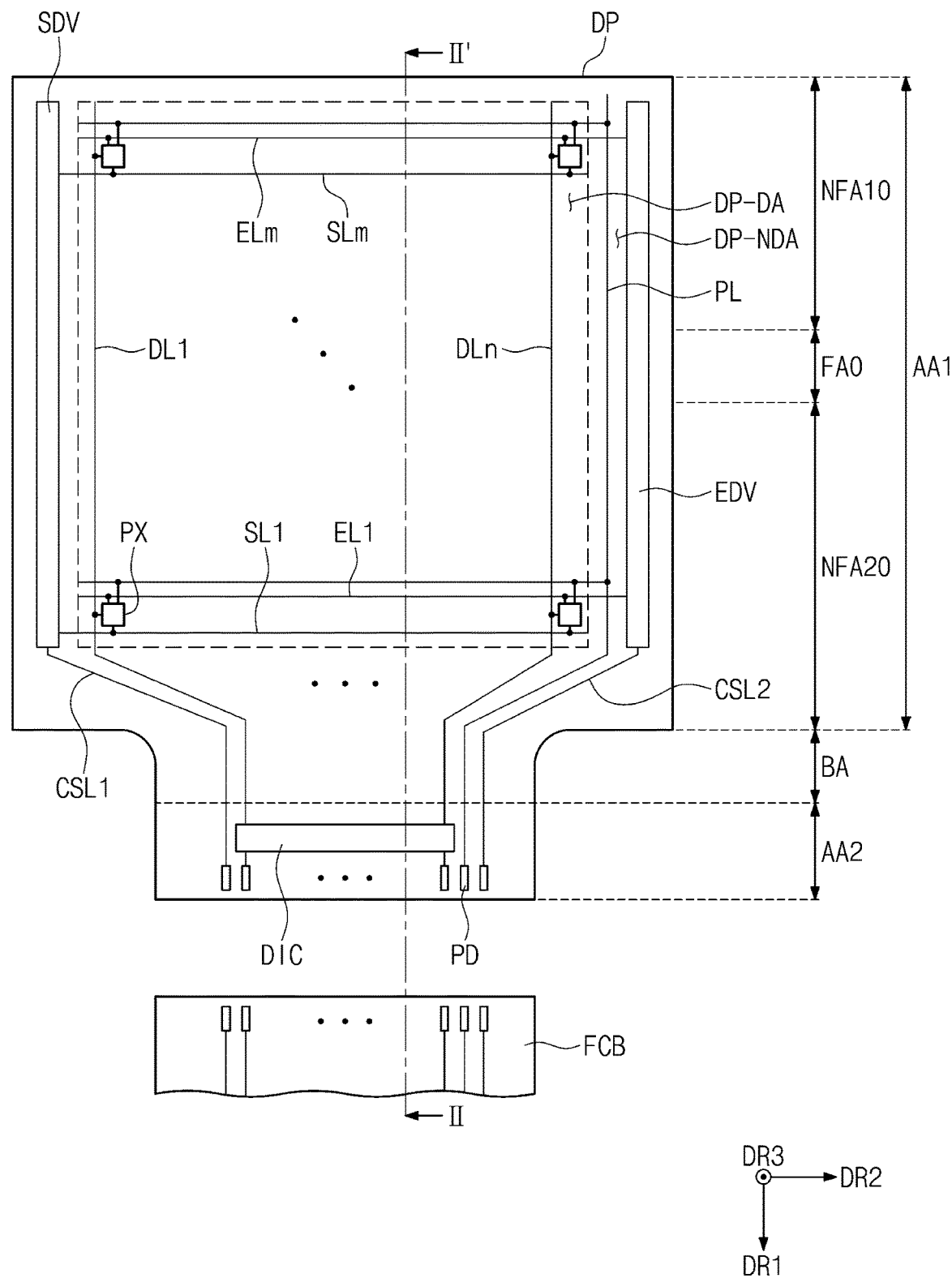
FIG. 4 is a plan view of a display panel according to some embodiments of the inventive concept.

The plurality of sensing electrodes overlap the display region DP-DA (see FIG. 4). The trace lines are arranged to overlap the non-display region DP-NDA (see FIG. 4). The trace lines may extend toward the bottom of a second panel region AA2 via a bending region BA (see, e.g., FIG. 4 and FIG. 6) so as to be adjacent to pads PD illustrated in FIG. 4. In this case, the trace lines may be located on a layer different from the signal lines SL1-SLm, DL1-DLn, EL1-ELm, CSL1, CSL2, and PL (see FIG. 4) of the circuit element layer.

The trace lines may be connected to the signal lines (input signal lines) provided for the input sensor IS of the display panel DP in a first panel region AA1 illustrated in FIG. 4. The input signal lines are different from the signal lines SL1-SLm, DL1-DLn, EL1-ELm, CSL1, CSL2, and PL illustrated in FIG. 4, but may be located on the same layer as any one of these signal lines. The input signal lines may be respectively connected to corresponding pads PD (see FIG. 4). As a result, the trace lines may be electrically connected to the same flexible printed circuit film FCB (see FIG. 4) as the signal lines of the circuit element layer.

The optical film LF may reduce the reflectance of external light. The optical film LF may include a phase retarder and/or a polarizer. The optical film LF may include at least a polarizing film.

The optical film LF according to some embodiments of the inventive concept may include color filters. The color filters may have a certain arrangement. The arrangement of the color filters may be determined in consideration of emission colors of the pixels PX included in the display panel DP. In addition, the optical film LF may further include a black matrix adjacent to the color filters.

The optical film LF according to some embodiments of the inventive concept may include a destructive interference structure. For example, the destructive interference structure may include a first reflective layer and a second reflective layer located on different layers. A first reflected light and a second reflected light respectively reflected from the first reflective layer and the second reflective layer may be destructively interfered, and thus the reflectance of external light may be reduced.

A lower member LM may include various functional members. A light-shielding layer that blocks the light incident on the display panel DP, an impact absorbing layer that absorbs external impact, a support layer that supports the display panel DP, a heat-radiating layer that radiates heat generated in the display panel DP, and the like may be included. A detailed description of the stack structure of the lower member LM will be described below.

FIG. 4 is a plan view of a display panel according to some embodiments of the inventive concept.

Referring to FIG. 4, a display panel DP may include a display region DP-DA and a non-display region DP-NDA around the display region DP-DA. The display region DP-DA and the non-display region DP-NDA are divided according to whether or not the pixels PX are arranged. The pixels PX are located in the display region DP-DA. A scan driver SDV, a data driver, and an emission driver EDV may be located in the non-display region DP-NDA. The data driver may be a portion of the circuit configured in a driving chip DIC.

The display panel DP includes a first panel region AA1, a second panel region AA2, and a bending region BA divided within a first direction DR1. The second panel region AA2 and the bending region BA may be a portion of the non-display region DP-NDA. The bending region BA is located between the first panel region AA1 and the second panel region AA2.

The first panel region AA1 is a region corresponding to the display surface DS of FIG. 1A. The first panel region AA1 may include a first non-folding region NFA10, a second non-folding region NFA20, and a foldable region FAO. The first non-folding region NFA10, the second non-folding region NFA20, and the foldable region FAO respectively correspond to the first non-folding region NFA1, the second non-folding region NFA2, and the foldable region FA of FIGS. 1A and 1B. The foldable region FAO may be referred to as a first region FAO, the first non-folding region NFA10 may be referred to as a second region NFA10, and the second non-folding region NFA20 may be referred to as a third region NFA20.

In the second direction DR2, a length (or a width) of the bending region BA and the second panel region AA2 may be smaller than a length (or a width) of the first panel region AA1. A region with a short length in the bending axis direction may be bent more easily.

The display panel DP may include a plurality of pixels PX, a plurality of scan lines SL1 to SLm, a plurality of data lines DL1 to DLn, and a plurality of emission lines EL1 to ELm, a first and a second control lines CSL1 and CSL2, a power supply line PL, and a plurality of pads PD. Herein, m and n are natural numbers. The pixels PX may be connected to the scan lines SL1 to SLm, the data lines DL1 to DLn, and the emission lines EL1 to ELm.

The scan lines SL1 to SLm may extend in the second direction DR2 to be electrically connected to the scan driver SDV. The data lines DL1 to DLn may extend in the first direction DR1, and may be electrically connected to the driving chip DIC via the bending region BA. The emission lines EL1 to ELm may extend in the second direction DR2 to be electrically connected to the emission driver EDV.

The power supply line PL may include a portion extended in the first direction DR1 and a portion extended in the second direction DR2. The portion extended in the second direction DR2 and the portion extended in the first direction DR1 may be located on different layers. The portion of the power supply line PL extended in the first direction DR1 may extend to the second panel region AA2 via the bending region BA. The power supply line PL may provide a first voltage to pixels PX.

The first control line CSL1 may connect to the scan driver SDV, and may extend toward the bottom of the second panel region AA2 via the bending region BA. The second control line CSL2 may connect to the emission driver EDV, and may extend toward the bottom of the second panel region AA2 via the bending region BA.

When viewed in a plane view, the pads PD may be located adjacent to the bottom of the second panel region AA2. The driving chip DIC, the power supply line PL, the first control line CSL1, and the second control line CSL2 may be electrically connected to pads PD. The flexible printed circuit film FCB may be electrically connected to pads PD via an anisotropic conductive adhesive layer.

Figure 5:
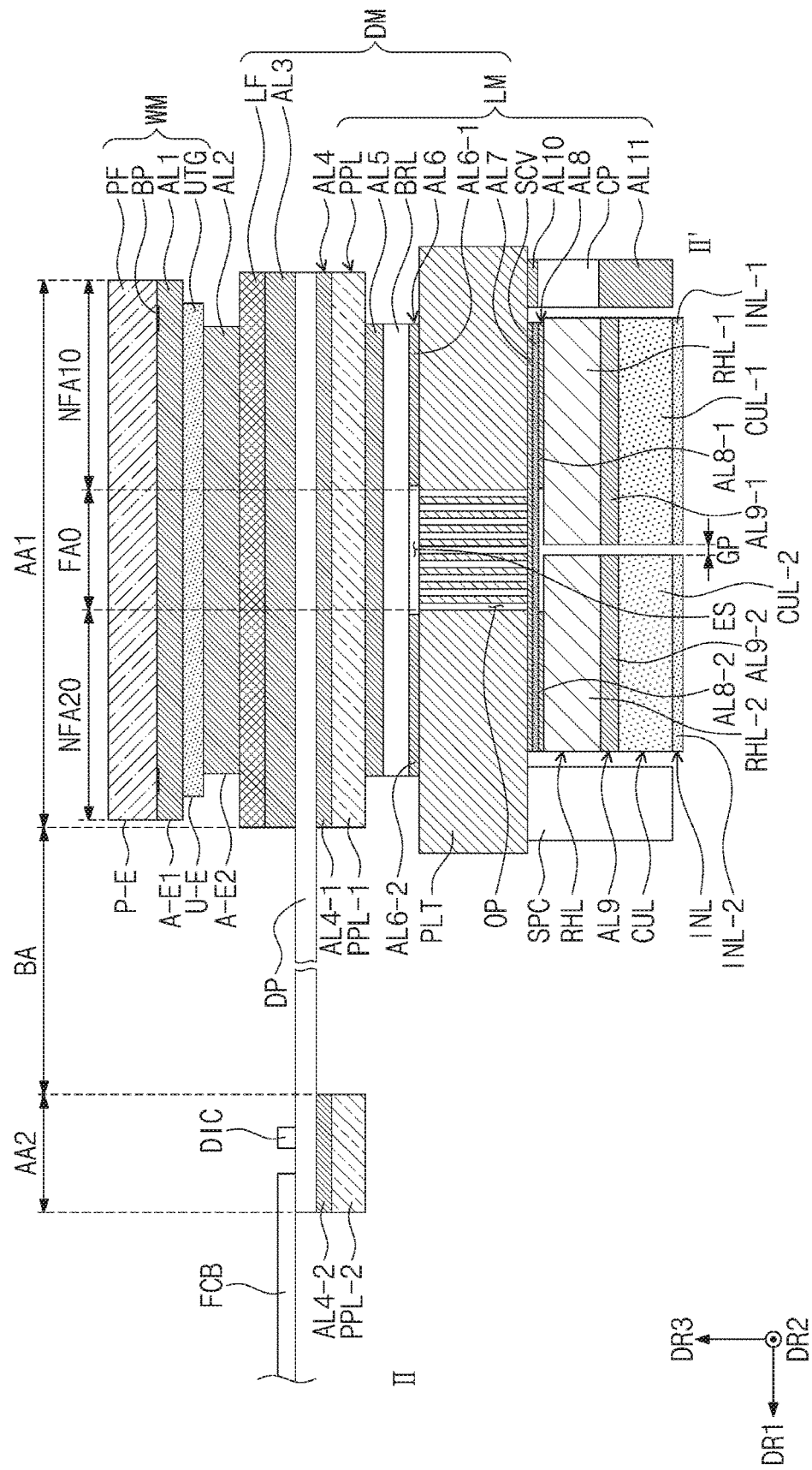
FIG. 5 is a cross-sectional view of a display device according to some embodiments of the inventive concept.
Figure 6:
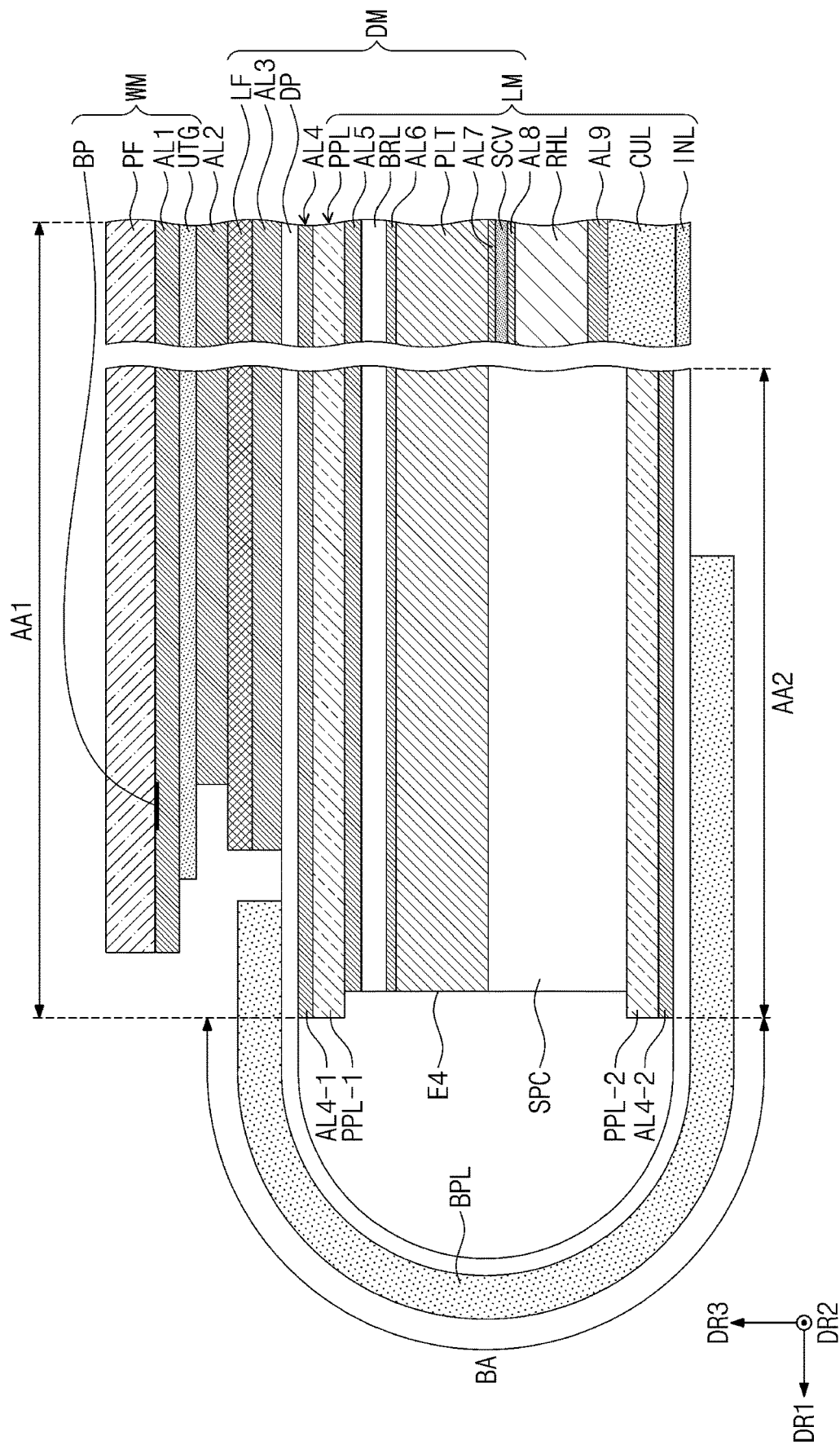
FIG. 6 is a cross-sectional view of a display device according to some embodiments of the inventive concept.

FIG. 5 is a cross-sectional view of a display device according to some embodiments of the inventive concept. FIG. 6 is a cross-sectional view of a display device according to some embodiments of the inventive concept.

FIG. 5 illustrates a state before a display device DD is installed in an electronic device ED (see FIG. 1A), and FIG. 6 illustrates a state where a display device DD is installed in an electronic device ED (see FIG. 1A).

Referring to FIG. 6, when the display device DD is installed in the electronic device ED (see FIG. 1A), the first panel region AA1 and the second panel region AA2 of the display panel DP may be located on the different planes. The second panel region AA2 may be located below the first panel region AA1.

Referring to FIG. 5 and FIG. 6, a window module WM may include a thin film glass substrate UTG, a plastic film PF located on the thin film glass substrate UTG, a first adhesive layer AL1 coupling the thin film glass substrate UTG and the plastic film PF, and a bezel pattern BP.

The bezel pattern BP overlaps the non-display region NDA illustrated in FIG. 1A. The bezel pattern BP may be located on one surface of the thin film glass substrate UTG or one surface of the plastic film PF. FIG. 5 illustrates by way of example the bezel pattern BP located on the lower surface of the plastic film PF. Embodiments of the inventive concept are not limited thereto, and the bezel pattern BP may be located on the upper surface of the plastic film PF. The bezel pattern BP may be formed as a colored light-shielding film by, for example, a coating method. The bezel pattern BP may include a base material and a dye or pigment mixed with the base material. The bezel pattern BP may have closed line shape on a plane.

The thickness of the thin film glass substrate UTG may be about 15 µm (micrometer) to about 45 µm, for example, about 30 µm. The thin film glass substrate UTG may be chemically strengthened glass. As the thin film glass substrate UTG is applied, occurrence of wrinkles may be minimized even if folding and unfolding are repeated. According to some embodiments of the inventive concept, a synthetic resin film may be applied instead of the thin film glass substrate UTG.

The thickness of the plastic film PF may be about 50 µm to about 80 µm, for example, about 65 µm. The plastic film PF may include polyimide, polycarbonate, polyamide, triacetylcellulose, or polymethylmethacrylate, or polyethylene terephthalate. According to some embodiments, at least one of a hard coating layer, an anti-fingerprint layer, or an anti-reflection layer may be located on the upper surface of the plastic film PF.

The first adhesive layer AL1 may be a pressure sensitive adhesive (PSA) film or an optically clear adhesive (OCA) member. Adhesive layers described below also may be the same as the first adhesive layer AL1, and may include any suitable adhesive material.

The thickness of the first adhesive layer AL1 may be about 20 µm to about 50 µm, for example, about 35 µm. The first adhesive layer AL1 may have a thickness sufficient to cover the bezel pattern BP. For example, the thickness of the bezel pattern BP may be about 3 µm to about 8 µm, and the first adhesive layer AL1 may have a thickness so that no bubbles are generated around the bezel pattern BP.

The first adhesive layer AL1 may be separated from the thin film glass substrate UTG. The strength of the thin film glass substrate UTG is lower than that of the plastic film PF so that a scratch may be generated relatively easily. After separate the first adhesive layer AL1 and the plastic film PF, a new plastic film PF may be attached to the thin film glass substrate UTG.

On a plane, an edge U-E of the thin film glass substrate UTG is not overlapped with the bezel pattern BP. As the above-described condition is satisfied, the edge U-E of the thin film glass substrate UTG is exposed from the bezel pattern BP, and a detection apparatus may detect a fine crack generated in the edge U-E of the thin film glass substrate UTG. The detection apparatus may include a microscope.

The detection apparatus may take a photograph of the edge U-E of the thin film glass substrate UTG on the upper surface of the plastic film PF to check a crack started from the edge U-E of the thin film glass substrate UTG.

On a plane, an edge P-E of the plastic film PF and an edge A-E1 of the first adhesive layer AL1 may be aligned. The plastic film PF and the first adhesive layer AL1 may have the same area and the same shape.

The window module WM and the display module DM may be coupled by a second adhesive layer AL2. The second adhesive layer AL2 may include a pressure sensitive adhesive or a clear adhesive such as an optically clear adhesive. The thickness of the second adhesive layer AL2 may be about 35 μm to about 65 μm, for example, about 50 μm.

On a plane, an edge A-E2 of the second adhesive layer AL2 may overlap the window module WM. For example, the edge A-E2 of the second adhesive layer AL2 may overlap the thin film glass substrate UTG. In a process of attaching the window module WM and the display module DM, pressure may be applied to the second adhesive layer AL2. The second adhesive layer AL2, under pressure, may be stretched in a direction parallel to the first direction DR1 and the second direction DR2. In this case, the area of the second adhesive layer AL2 may be smaller than the area of the thin film glass substrate UTG to prevent the second adhesive layer AL2 from protruding more than the thin film glass substrate UTG.

When the first adhesive layer AL1 and the second adhesive layer AL2 are attached, the thin film glass substrate UTG may not slip so that a buckling phenomenon or a crack may occur in the thin film glass substrate UTG during a folding operation of the electronic device ED (see FIG. 1A). However, according to some embodiments of the inventive concept, the area of the second adhesive layer AL2 is smaller than the area of the thin film glass substrate UTG so that the first adhesive layer AL1 and the second adhesive layer AL2 may not be attached, and the probability that a foreign material adheres to the second adhesive layer AL2 may be reduce.

The display module DM may include an optical film LF, a display panel DP, a panel protective layer PPL, a barrier layer BRL, a support layer PLT, a cover layer SCV, a heat-radiating layer RHL, a cushion layer CUL, an insulating layer INL, a spacer SPC, a step compensation pattern CP, and third to eleventh adhesive layers AL3 to AL11. The third to eleventh adhesive layers AL3 to AL11 may include a pressure sensitive adhesive or a clear adhesive such as an optically clear adhesive. According to some embodiments of the inventive concept, some of the above-described components may be omitted. For example, the step compensation pattern CP and the tenth and eleventh adhesive layers AL10 and AL11 associated therewith may be omitted.

The optical film LF is located in the first panel region AA1. The optical film LF covers at least the display region DP-DA (see FIG. 2). The second adhesive layer AL2 is coupled to the optical film LF and the window module WM, and the third adhesive layer AL3 is coupled to the optical film LF and the display panel DP. Although only the display panel DP is illustrated in FIG. 5 and FIG. 6, an input sensor IS may be further located between the display panel DP and the third adhesive layer AL3, as illustrated in FIG. 3.

The panel protective layer PPL may be located below the display panel DP. The panel protective layer PPL may protect a lower portion of the display panel DP. The panel protective layer PPL may include a flexible plastic material. The panel protective layer PPL may prevent or reduce instances of a scratch being generated on the rear surface of the display panel DP during the manufacturing process of the display panel DP. The panel protective layer PPL may be a colored polyimide film. For example, the panel protective layer PPL may be an opaque yellow film, but is not limited thereto.

According to some embodiments of the inventive concept, a panel protective layer PPL may not be located in a bending region BA. The panel protective layer PPL may include a first panel protective layer PPL-1 protecting a first panel region AA1 of a display panel DP and a second panel protective layer PPL-2 protecting a second panel region AA2 of a display panel DP. When the bending region BA is bent, with the second panel region AA2 of the display panel DP, the second panel protective layer PPL-2 may be located below the first panel region AA1 and the first panel protective layer PPL-1. The panel protective layer PPL is not located in the bending region BA, and thus the bending region BA may be bent more easily.

The fourth adhesive layer AL4 may couple the panel protective layer PPL and the display panel DP. The fourth adhesive layer AL4 may include a first portion AL4-1 corresponding to the first panel protective layer PPL-1 and a second portion AL4-2 corresponding to the second panel protective layer PPL-2. The first portion AL4-1 may couple the first panel protective layer PPL-1 to the first panel region AA1 of the display panel DP, and the second portion AL4-2 may couple the second panel protective layer PPL-2 to the second panel region AA2 of the display panel DP.

The barrier layer BRL may be located below the panel protective layer PPL. The fifth adhesive layer AL5 may be located between the panel protective layer PPL and the barrier layer BRL to couple the barrier layer BRL to the panel protective layer PPL. The fifth adhesive layer AL5 may be attached to the upper surface of the barrier layer BRL, and the fifth adhesive layer AL5 may be referred to as an upper adhesive layer.

The barrier layer BRL may increase resistance to a compressive force by an external pressing. Accordingly, the barrier layer BRL may serve to prevent deformation of the display panel DP. The barrier layer BRL may include a flexible plastic material such as polyimide or polyethyleneterephthalate.

In addition, the barrier layer BRL may absorb light incident from the outside. The barrier layer BRL may include a light-shielding material or may be a colored film having low light transmittance. For example, the barrier layer BRL may be a black plastic film, for example, a black polyimide film. When the display module DM is viewed from the upper side of the window module WM, components located below the barrier layer BRL may not be visibly recognized to a user.

The support layer PLT is located below the barrier layer BRL. The support layer PLT may be located below the first panel region AA1. The support layer PLT may overlap the first panel region AA1.

The support layer PLT may include a material having an elastic modulus of 60 GPa or more. The support layer PLT may include a metal material such as a stainless steel. For example, the support layer PLT may include SUS 304, but is not limited thereto, and the support layer PLT may include various metal materials. The support layer PLT may support the display panel DP. In addition, the support layer PLT may enhance the heat-radiating performance of the display device DD.

A plurality of openings OP may be defined in a portion region of the support layer PLT corresponding to the foldable region FAO. The flexibility of the support layer PLT may be improved by openings OP.

The area of the barrier layer BRL may be smaller than the area of the support layer PLT. The areas may be areas on a plane. On a plane, the barrier layer BRL may overlap with a portion of the support layer PLT. Another portion of the support layer PLT may not overlap with the barrier layer BRL.

The sixth adhesive layer AL6 may be located between the barrier layer BRL and the support layer PLT. The sixth adhesive layer AL6 may couple the barrier layer BRL and the support layer PLT. The sixth adhesive layer AL6 may include a first portion AL6-1 and a second portion AL6-2 that are spaced apart from each other.

The first portion AL6-1 and the second portion AL6-2 may be spaced apart from each other with the plurality of openings OP interposed therebetween. On a plane, the sixth adhesive layer AL6 may not overlap with the plurality of openings OP. Also, on a plane, the sixth adhesive layer AL6 may be spaced apart from the plurality of openings OP.

The first portion AL6-1 may overlap with the second region NFA10, the second portion AL6-2 may overlap with the third region NFA20, and each of the first portion AL6-1 and the second portion AL6-2 may not overlap with the first region FAO. The flexibility of the support layer PLT may be improved by not forming the sixth adhesive layer AL6 in the region corresponding to the first region FAO.

In the region overlapping with the first region FA, the barrier layer BRL may be spaced apart from the support layer PLT. That is, in the region overlapping the first region FAO, an empty space ES may be defined between the support layer PLT and the barrier layer BRL. Air may be located in the empty space ES.

When the electronic device ED (see FIG. 1A) is folded, the empty space ES is defined between the barrier layer BRL and the support layer PLT so that the shapes of the plurality of openings OP defined in the support layer PLT may not be visibly recognized from the outside of the electronic device ED (see FIG. 1A).

Also, as the barrier layer BRL includes a light-shielding material, or is applied as a colored film having low light transmittance, the color difference of the barrier layer BRL may not be visibly recognized from the outside. For example, a color difference in the support layer PLT between a first support region in which the plurality of openings OP are defined and a second support region in which the plurality of openings OP are not defined may not be visually recognized from the outside. The first support region may be a region overlapping with the first region FAO, and the second support region may be a region overlapping with the second region NFA10 and the third region NFA20.

The thickness of the sixth adhesive layer AL6 may be smaller than the thickness of the fifth adhesive layer AL5. For example, the thickness of the fifth adhesive layer AL5 may be about 25 µm, and the thickness of the sixth adhesive layer AL6 may be about 16 µm.

As the thickness of the sixth adhesive layer AL6 is thinner, the step difference by the sixth adhesive layer AL6 may reduce. As the step difference is smaller, there may be a reduction in the shape deformation of the stack structures due to folding and unfolding of the electronic device ED (see FIG. 1A), but the plurality of openings OP may be visibly recognized, or the sixth adhesive layer AL6 may be detached by repeated folding operations. As the thickness of the sixth adhesive layer AL6 is thicker, the plurality of openings OP may not be visibly recognized (or the perceptibility of the openings OP may be reduced), and that the reliability of adhesion of the sixth adhesive layer AL6 increases by the repeated folding operations, but the step difference may increase. Accordingly, the thickness of the sixth adhesive layer AL6 may be selected within an appropriate range considering the folding reliability, the adhesion reliability, and the visibility of the plurality of openings OP.

The seventh adhesive layer AL7 may be located below the support layer PLT, and the cover layer SCV may be located below the seventh adhesive layer AL7. The support layer PLT and the cover layer SCV may be coupled by the seventh adhesive layer AL7. The cover layer SCV may be prepared in a sheet form and attached to the support layer PLT.

The seventh adhesive layer AL7 and the cover layer SCV may cover the plurality of openings OP defined in the support layer PLT. Accordingly, the cover layer SCV may prevent a foreign material from flowing into the plurality of openings OP. The cover layer SCV may have lower elastic modulus than the support layer PLT. For example, the cover layer SCV may include thermoplastic polyurethane, rubber, or silicone, but embodiments of the inventive concept are not limited thereto.

The eighth adhesive layer AL8 may be located below the cover layer SCV. The eighth adhesive layer AL8 may include a first cover portion AL8-1 and a second cover portion AL8-2. The first cover portion AL8-1 and the second cover portion AL8-2 may be spaced apart from each other. On a plane, the first cover portion AL8-1 and the second cover portion AL8-2 may be spaced apart from each other with the plurality of openings OP interposed therebetween. The first cover portion AL8-1 and the second cover portion AL8-2 may not overlap in the first region FAO.

The heat-radiating layer RHL may be located below the eighth adhesive layer AL8. The heat-radiating layer RHL may be a sheet having high thermal conductivity. The heat-radiating layer RHL may include a metal or a metal alloy, for example, the heat-radiating layer RHL may include copper, a copper alloy, or graphite.

The heat-radiating layer RHL may include a first heat-radiating layer RHL-1 and a second heat-radiating layer RHL-2. The first heat-radiating layer RHL-1 and the second heat-radiating layer RHL-2 may be spaced apart by an interval (e.g., a set or predetermined interval) GP. The interval (e.g., the set or predetermined interval) GP may be about 0.4 mm (millimeter) to about 2.4 mm, but embodiments are not particularly limited thereto. The interval (e.g., the set or predetermined interval) GP may be arranged to correspond to the foldable region FAO.

The first heat-radiating layer RHL-1 may be coupled to the cover layer SCV via the first cover portion AL8-1, and the second heat-radiating layer RHL-2 may be coupled to the cover layer SCV via the second cover portion AL8-2. On a plane, the first heat-radiating layer RHL-1 may overlap with a portion of the first region FAO and a second region NFA10, and the second heat-radiating layer RHL-2 may overlap with another portion of the first region FAO and the third region NFA20.

On a plane, a portion of the first heat-radiating layer RHL-1 may overlap with a portion of the plurality of openings OP, and a portion of the second heat-radiating layer RHL-2 may overlap with another portion of the plurality of openings OP. The first heat-radiating layer RHL-1 and the second heat-radiating layer RHL-2 may serve to support the support layer PLT. For example, a region in which the plurality of openings OP of the support layer PLT are defined may be supported by the first heat-radiating layer RHL-1 and the second heat-radiating layer RHL-2. Accordingly, the first heat-radiating layer RHL-1 and the second heat-radiating layer RHL-2 may be respectively referred to as a first lower support layer and a second lower support layer.

The ninth adhesive layer AL9 may be located below the heat-radiating layer RHL. The ninth adhesive layer AL9 may include a first portion AL9-1 corresponding to the first heat-radiating layer RHL-1 and a second portion AL9-2 corresponding to the second heat-radiating layer RHL-2. The first portion AL9-1 and the second portion AL9-2 may be spaced apart by an interval (e.g., a set or predetermined interval) GP.

The cushion layer CUL may be located below the ninth adhesive layer AL9. The thickness of the cushion layer CUL may be about 75 μm, but embodiments are not particularly limited thereto. The cushion layer CUL may absorb an external impact to protect the display panel DP. The elastic modulus of the cushion layer CUL is lower than the elastic modulus of the support layer PLT. The cushion layer CUL may include a foam sheet having a certain elastic force. The cushion layer CUL may include sponge or polyurethane.

The cushion layer CUL may include a first cushion layer CUL-1 corresponding to the first portion AL9-1 and a second cushion layer CUL-2 corresponding to the second portion AL9-2. The first cushion layer CUL-1 and the second cushion layer CUL-2 may be spaced apart by an interval (e.g., a set or predetermined interval) GP. On a plane, the interval (e.g., the set or predetermined interval) GP between the first cushion layer CUL-1 and the second cushion layer CUL-2 may overlap with the first region FAO. On a plane, the first cushion layer CUL-1 may overlap with a portion of the first region FAO and a second region NFA10, and the second cushion layer CUL-2 may overlap with another portion of the first region FAO and the third region NFA20.

Unlike embodiments of the inventive concept, if the cushion layer CUL is located between the support layer PLT and the display panel DP, when the display panel DP is pressed, the shape of the cushion layer CUL is deformed so that the display panel DP may be easily deformed. However, according to some embodiments of the inventive concept, the cushion layer CUL may be spaced apart from the display panel DP with the support layer PLT interposed therebetween. Accordingly, when the display panel DP is pressed, the deformation of the display panel DP may be reduced compared to a comparative example. In addition, as the cushion layer CUL is located below the heat-radiating layer RHL on which the cushion layer CUL is firmly supported is firmly supported, the impact absorption performance of the cushion layer CUL may be improved. The insulating layer INL may be located below the cushion layer CUL. FIG. 5 illustrates embodiments in which an insulating tape is utilized. The insulating layer INL may prevent or reduce the inflow of static electricity. According to some embodiments, the flexible printed circuit film FCB may be located on the insulating layer INL. The insulating layer INL may prevent the flexible printed circuit film FCB from generating electrical interference with members located on the insulating layer INL.

One surface of the step compensation pattern CP may be coupled to the support layer PLT via the tenth adhesive layer AL10. The eleventh adhesive layer AL11 is formed on another surface of the step compensation pattern CP. The eleventh adhesive layer AL11 may be used when the display device (DD, see FIG. 2) is coupled to other components of the electronic device ED (see FIG. 2).

Referring to FIG. 6, the bending region BA may be bent so that the second panel region AA2 is located below the first panel region AA1. Accordingly, the driving chip DIC (see FIG. 5) may be located below the first panel region AA1. That is, the first panel region AA1 and the second panel region AA2 are located on the different planes (or reference planes). The bending region BA may be bent so as to be convex in the transverse direction on a cross section. The bending region BA has a certain curvature and a radius of curvature. The radius of curvature may be about 0.1 mm to about 0.5 mm.

The bending region BA may be bent to surround an edge E4 of the support layer PLT. A portion of the support layer PLT may be located between the first panel region AA1 and the second panel region AA2.

A bending protective layer BPL is located at least in the bending region BA. The bending protective layer BPL may overlap the bending region BA, the first panel region AA1, and the second panel region AA2. The bending protective layer BPL may be located on a portion of the first panel region AA1 and a portion of the second panel region AA2 as well as in the bending region BA.

The bending protective layer BPL may be bent together with bending region BA. The bending protective layer BPL protects the bending region BA from an external impact, and controls a neutral plane of the bending region BA. The bending protective layer BPL controls stress of the bending region BA to make the neutral plane closer to the signal lines located in the bending region BA.

One surface of the second panel protective layer PPL-2 to which the second portion AL4-2 of the fourth adhesive layer AL4 is not attached is attached to the spacer SPC. FIG. 5 and FIG. 6 illustrates the spacer SPC as a single layer, but the spacer SPC may have a multilayer structure in which the base layer is located between two adhesive layers. The base layer may include graphite having excellent heat-radiating properties.

Figure 7A:
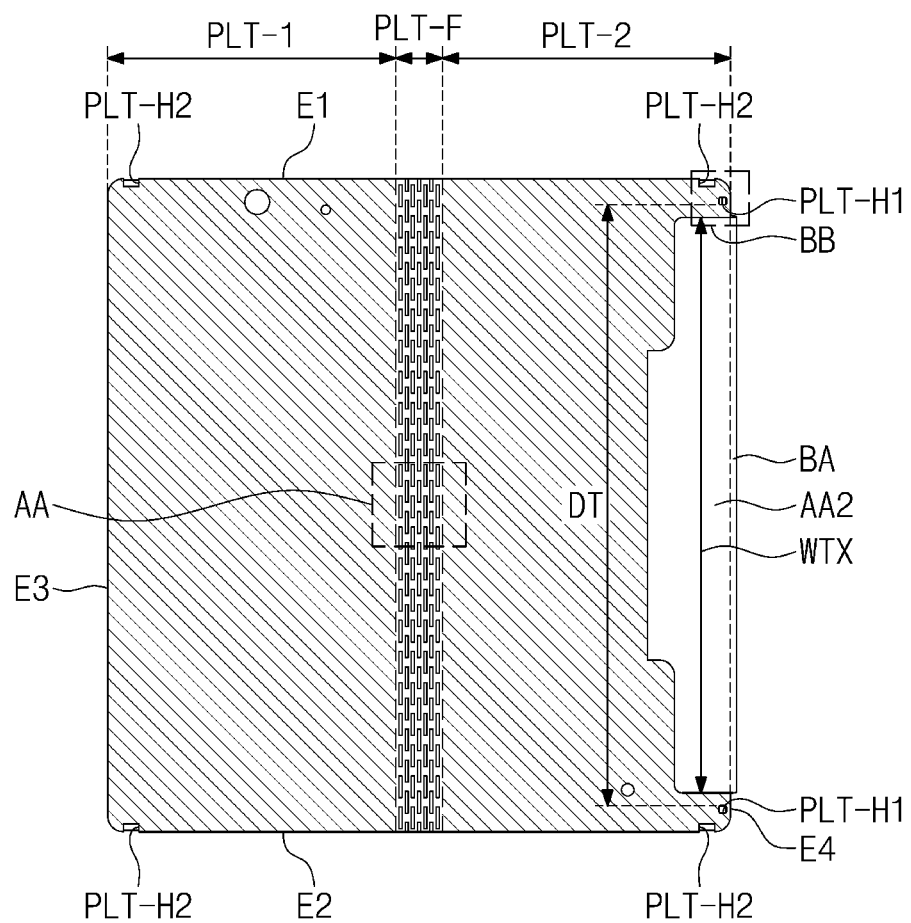
FIG. 7A is a rear view illustrating some components of a display device according to some embodiments of the inventive concept.
Figure 7A:
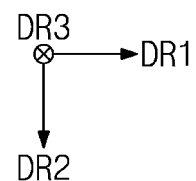
Figure 7B:
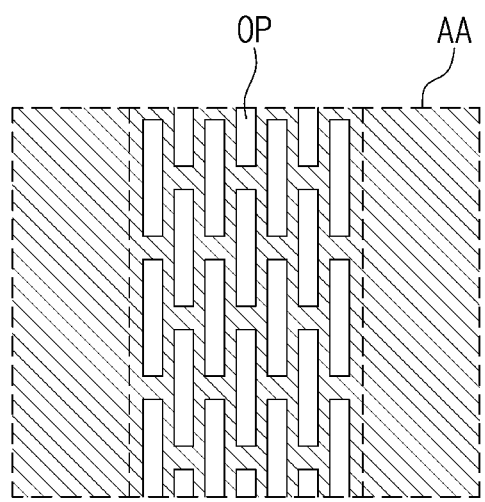
FIG. 7B is an enlarged view illustrating further details of the region AA of FIG. 7A according to some embodiments of the inventive concept.
Figure 7B:
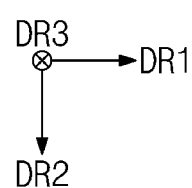

FIG. 7A is a rear view illustrating some components of a display device according to some embodiments of the inventive concept. FIG. 7B is an enlarged view illustrating region AA of FIG. 7A.

Referring to FIG. 7A and FIG. 7B, a support layer PLT may include a folding region PLT-F corresponding to the first region FAO (see FIG. 5), a first region (PLT-1) corresponding to the second region NFA10 (see FIG. 5), and a second region (PLT-2) corresponding to the third region NFA20 (see FIG. 5). A plurality of openings OP may be formed in the folding region PLT-F.

The plurality of openings OP may be arranged in a certain rule. The plurality of openings OP may be arranged in a grid form. Each of the plurality of openings OP may be defined to completely penetrate the lower surface of the support layer PLT from the upper surface of the support layer PLT. Forming the plurality of openings OP in the folding region PLT-F reduces the area of the folding region PLT-F of the support layer PLT, and thus lowers the rigidity of the folding region PLT-F. Accordingly, the folding region PLT-F may have higher pliability than when the plurality of openings OP are not formed.

The support layer PLT may include a first edge E1 and a second edge E2 extending along a first direction DR1 and a third edge E3 and a fourth edge E4 extending along a second direction DR2.

A plurality of a first alignment openings PLT-H1 and a plurality of a second alignment openings PLT-H2 may be defined in the support layer PLT. For example, two first alignment openings PLT-H1 and four second alignment openings PLT-H2 may be defined in the support layer PLT.

The first alignment openings PLT-H1 may be spaced apart from each other in the second direction DR2. For example, the first alignment openings PLT-H1 may be defined to be spaced apart with the second panel region AA2 interposed therebetween. The distance DT between the first alignment openings PLT-H1 in the second direction DR2 may be greater than the width WTX of the second panel region AA2 in the second direction DR2. The first alignment openings PLT-H1 may not overlap with the second panel region AA2, and may be spaced apart from the second panel region AA2 in the second direction DR2. In addition, the first alignment openings PLT-H1 may be defined to be spaced apart from the plurality of openings OP in the first direction DR1.

The first alignment openings PLT-H1 may be defined to be closest to the fourth edge E4 among the first to fourth edges E1, E2, E3, and E4. Two of the second alignment openings PLT-H2 may be defined to be closest the first edge E1, and the remaining two second alignment openings PLT-H2 may be defined to be closest to the second edge E2.

Figure 8:
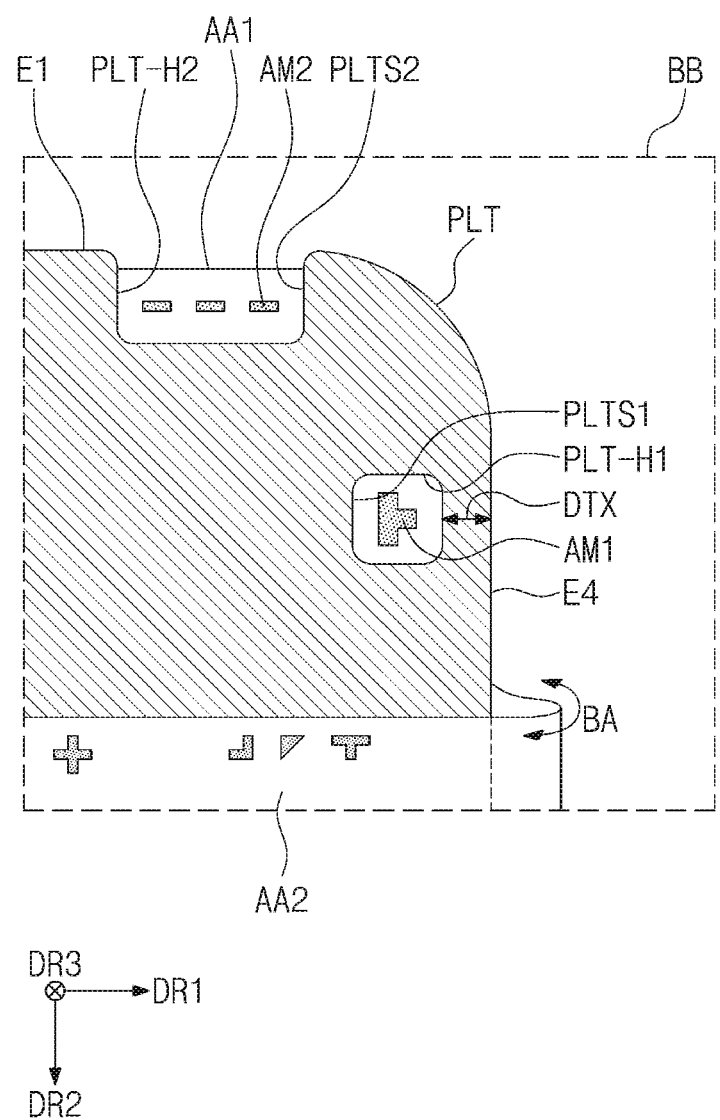
FIG. 8 is an enlarged view illustrating further details of the region BB of FIG. 7A according to some embodiments of the inventive concept.

FIG. 8 is an enlarged view illustrating region BB of FIG. 7A.

Referring to FIG. 8, the first panel region AA1 may include a first alignment mark AM1 and a second alignment mark AM2. The first alignment mark AM1 may overlap with the first alignment opening PLT-H1, and the second alignment mark AM2 may overlap with the second alignment opening PLT-H2.

The bending region BA may be bent while surrounding the fourth edge E4. The first alignment opening PLT-H1 may be closest to the fourth edge E4. The first alignment opening PLT-H1 may be spaced apart from the fourth edge E4 by a certain distance DTX. That is, the first alignment opening PLT-H1 may be completely surrounded by the support layer PLT. A sidewall PLTS1 of the support layer PLT defining the first alignment opening PLT-H1 may have a closed curve shape.

FIG. 8 illustrates by way of example that the first alignment opening PLT-H1 has a rounded tetragonal shape with four straight lines and four curved lines, but embodiments of the inventive concept are not limited thereto. For example, the shape of the first alignment opening PLT-H1 may be changed into various shapes such as polygonal, circular, elliptical, irregular shape, or the like.

In a region adjacent to the fourth edge E4 adjacent to the bending region BA, static electricity may be suddenly discharged, and the frequency of occurrence of phenomena affecting peripheral elements may be more frequent than that of regions adjacent to other edges. According to some embodiments of the inventive concept, the first alignment opening PLT-H1 adjacent to the fourth edge E4 may be defined to be spaced apart from the fourth edge E4. In this case, the first panel region AA1 of the display panel DP (see FIG. 5) exposed by the first alignment opening PLT-H1 may be spaced apart from the fourth edge E4. Even if static electricity is suddenly discharged, the charge may be discharged through the support layer PLT rather than the display panel DP (see FIG. 5). Accordingly, the probability that the element included in the display panel DP is destroyed by electrostatic discharge may be reduced or removed. Therefore, the reliability of the display device DD (see FIG. 5) may be improved.

The second alignment opening PLT-H2 may be provided adjacent to the first edge E1. The second alignment opening PLT-H2 may be coupled to the first edge E1. Accordingly, the first edge E1 and a sidewall PLTS2 defining the second alignment opening PLT-H2 may be coupled to each other. On a plane, the sidewall PLTS2 may have an open curve shape.

Figure 9:
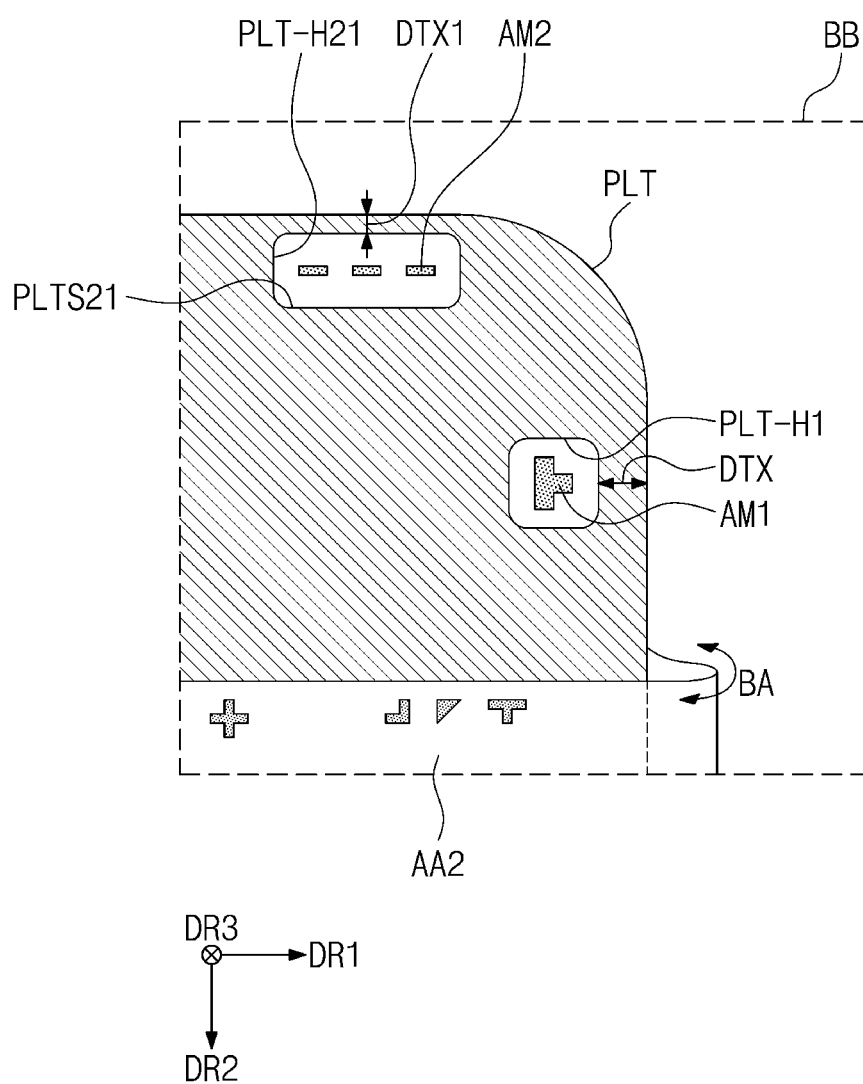
FIG. 9 is an enlarged view according to some embodiments of the inventive concept illustrating further details of a region BB of FIG. 7A.

FIG. 9 is an enlarged view according to some embodiments of the inventive concept illustrating a region corresponding to region BB of FIG. 7A. In the description of FIG. 9, parts that are different from FIG. 8 are described, and components that are the same as those described in FIG. 8 are denoted by the same reference numerals, and descriptions thereof are omitted.

Referring to FIG. 9, a second alignment opening PLT-H21 may be spaced apart from the first edge E1 by a certain distance DTX1. That is, the second alignment opening PLT-H21 may be completely surrounded by the support layer PLT. A sidewall of the support layer PLT defining the second alignment opening PLT-H21 may have a closed curve shape.

FIG. 9 illustrates by way of example the second alignment opening PLT-H21 as a tetragonal shape, but embodiments of the inventive concept are not limited thereto. For example, the shape of the second alignment opening PLT-H21 may be changed into various shapes such as polygonal, circular, elliptical, irregular shape, or the like.

According to some embodiments illustrated in FIG. 9, not only the first alignment opening PLT-H1 but also the second alignment opening PLT-H21 may be spaced apart from the edge of the support layer PLT. Accordingly, the reliability of the display device DD (see FIG. 2) about static electricity discharge may be further improved.

Figure 10:
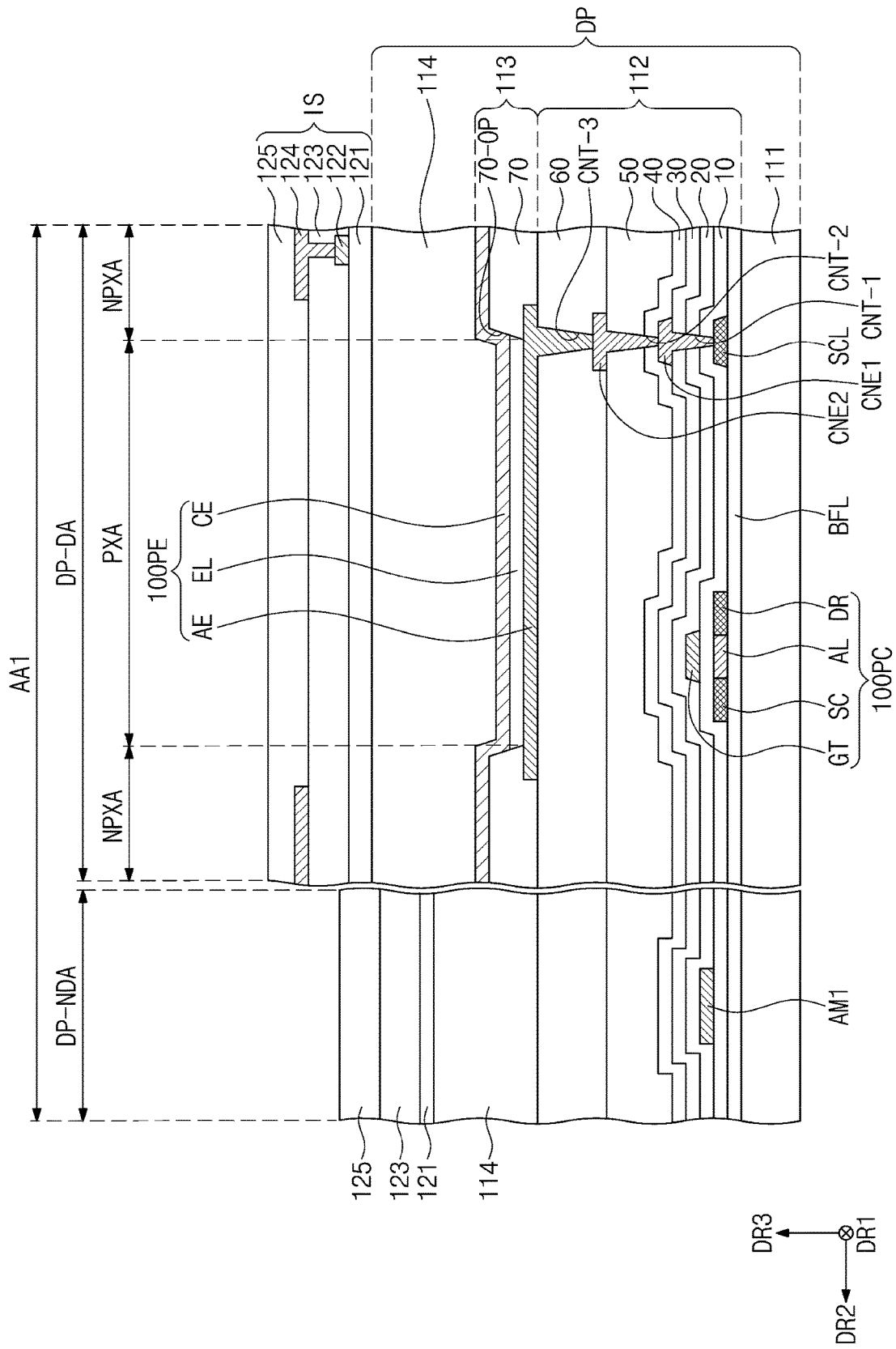
FIG. 10 is a cross-sectional view of a display panel and an input sensor according to some embodiments of the inventive concept.

FIG. 10 is a cross-sectional view of a display panel and an input sensor according to some embodiments of the inventive concept.

Referring to FIG. 10, a cross-sectional view of the display panel DP and the input sensor IS overlapping with the first panel region AA1 is illustrated.

The display panel DP may include a base layer 111, a circuit layer 112, a light emitting element layer 113, and an encapsulating layer 114.

The base layer 111 may be a member providing a base surface where the circuit layer 112 is located. The base layer 111 may be a glass substrate, a metal substrate, polymer substrate, or the like. However, embodiments of the inventive concept are not limited thereto, and the base layer 111 may be an inorganic layer, an organic layer, or a composite material layer.

The circuit layer 112 may be located on the base layer 111. The circuit layer 112 may include an insulating layer, a semiconductor pattern, a conductive pattern, a signal line, and the like. The insulating layer, the semiconductor layer, and the conductive layer are formed on the base layer 111 by a method such as coating and deposition, and then, the insulating layer, the semiconductor layer, and the conductive layer may be selectively patterned through several times of photolithographic processes. After that, the semiconductor pattern, the conductive pattern, and the signal line that are included in the circuit layer 112 may be formed.

At least one inorganic layer is formed on the upper surface of the base layer 111. The inorganic layer may include at least one of aluminum oxide, titanium oxide, silicon oxide, silicon nitride, silicon oxynitride, zirconium oxide, or hafnium oxide. The inorganic layer may be formed in a multilayer. The multi-layered inorganic layers may configure a barrier layer and/or a buffer layer. The display panel DP is illustrated to include the buffer layer BFL according to some embodiments of the inventive concept.

The buffer layer BFL may improve bonding force between the base layer 111 and the semiconductor pattern. The buffer layer BFL may include at least one of silicon oxide, silicon nitride, or silicon oxynitride. For example, the buffer layer BFL may include a structure in which a silicon oxide layer and a silicon nitride layer are alternately stacked.

The semiconductor pattern may be located on the buffer layer BFL. The semiconductor pattern may include poly-silicon. However, embodiments of the inventive concept are not limited thereto, and the semiconductor pattern may include amorphous silicon, low temperature polycrystalline silicon, or an oxide semiconductor.

FIG. 10 illustrates only a portion of the semiconductor pattern, the semiconductor pattern may be further located in other regions. The semiconductor pattern may be arranged in a specific rule over the pixels. The semiconductor pattern may have different electrical properties depending on whether the pattern is doped. The semiconductor pattern may include a first region having high conductivity and a second region having low conductivity. The first region may be doped with an N-type dopant or a P-type dopant. A P-type transistor may include a doped region doped with a P-type dopant, and an N-type transistor may include a doped region doped with an N-type dopant. The second region may be a non-doped region or a doped region doped with a lower concentration than the first region.

The first region may have a greater conductivity than the second region, and substantially serve as an electrode or a signal line. Substantially, the second region may correspond to an active region (or a channel) of the transistor. In other words, a portion of the semiconductor pattern may be an active region of the transistor, another portion may be a source or drain of the transistor, and the other portion may be a connection electrode or connection signal line.

Each of the pixels may have an equivalent circuit including seven transistors, one capacitor, and a light emitting element, and the equivalent circuit diagram of the pixels may be changed in various forms. FIG. 10 illustrates by way of example one transistor 100PC and a light emitting element 100PE included in the pixels.

A source SC, an active region AL, and a drain DR of the transistor 100PC may be formed from a semiconductor pattern. The source SC and the drain DR may extend in opposite directions from the active region AL, on a cross-section. FIG. 10 illustrates a portion of a signal connection line SCL formed from the semiconductor pattern. According to some embodiments, the signal connection line SCL may be connected to the drain DR of the transistor 100PC on a plane.

A first insulating layer 10 may be located on the buffer layer BFL. The first insulating layer 10 may overlap a plurality of pixels in common and may cover the semiconductor pattern. The first insulating layer 10 may be an inorganic layer and/or an organic layer, and may have a single layer or a multilayer structure. The first insulating layer 10 may include at least one of aluminum oxide, titanium oxide, silicon oxide, silicon nitride, silicon oxynitride, zirconium oxide, or hafnium oxide. According to some embodiments of the inventive concept, the first insulating layer 10 may be a single layer of silicon oxide. Not only the first insulating layer 10 but also an insulating layer of a circuit layer 112 to be described below may be an inorganic layer and/or an organic layer, and may have a single layer or a multilayer structure. The inorganic layer may include at least one of the above-described materials, but embodiments of the inventive concept are not limited thereto.

A gate GT of the transistor 100PC is located on the first insulating layer 10. The gate GT may be a portion of the metal pattern. The gate GT overlaps the active region AL. In the process of doping the semiconductor pattern, the gate GT may function as a mask.

A first alignment mark AM1 may be located on the first insulating layer 10. The first alignment mark AM1 may be located on the same layer as the gate GT, and may include the same material as the gate GT. The first alignment mark AM1 may be formed simultaneously through the same process as the gate GT.

A second insulating layer 20 may located on the first insulating layer 10, and may cover the gate GT. The second insulating layer 20 may overlap pixels in common. The second insulating layer 20 may be an inorganic layer and/or an organic layer, and may have a single layer or a multilayer structure. The second insulating layer 20 may include at least one of silicon oxide, silicon nitride, or silicon oxynitride. According to some embodiments of the inventive concept, the second insulating layer 20 may have a multilayer structure including a silicon oxide layer and a silicon nitride layer.

A third insulating layer 30 may be located on the second insulating layer 20. The third insulating layer 30 may have a single layer or a multilayer structure. For example, the third insulating layer 30 may have a multilayer structure including a silicon oxide layer and a silicon nitride layer.

A first connection electrode CNE1 may be located on the third insulating layer 30. The first connection electrode CNE1 may be connected to the signal connection line SCL through a contact hole CNT-1 penetrating the first, second, and third insulating layers 10, 20, and 30.

A fourth insulating layer 40 may be located on the third insulating layer 30. The fourth insulating layer 40 may be a single layer of silicone oxide. A fifth insulating layer 50 may be located on the fourth insulating layer 40. The fifth insulating layer 50 may be an organic layer.

A second connection electrode CNE2 may be located on the fifth insulating layer 50. The second connection electrode CNE2 may be connected to the first connection electrode CNE1 through a contact hole CNT-2 penetrating the fourth insulating layer 40 and the fifth insulating layer 50.

A sixth insulating layer 60 may be located on the fifth insulating layer 50, and may cover the second connection electrode CNE2. The sixth insulating layer 60 may be an organic layer.

The light emitting element layer 113 may be located on the circuit layer 112. The light emitting element layer 113 may include a light emitting element. For example, the light emitting element layer 113 may include an organic light emitting material, a quantum dot, a quantum rod, a micro LED, or a nano LED. Hereinafter, the light emitting element 100PE is described as an organic light emitting element by way of example, but embodiments of the inventive concept are not particularly limited thereto.

The light emitting element 100PE may include a first electrode AE, an emission layer EL, and a second electrode CE.

The first electrode AE may be located on the sixth insulating layer 60. The first electrode AE may be connected to the second connection electrode CNE2 through a contact hole CNT-3 penetrating the sixth insulating layer 60.

A pixel-defining film 70 may be located on the sixth insulating layer 60, and may cover a portion of the first electrode AE. An opening 70-OP is defined in the pixel-defining film 70. The opening 70-OP of the pixel-defining film 70 exposes at least a portion of the first electrode AE.

A display region DP-DA may include an emission region PXA and a non-emission region NPXA adjacent to the emission region PXA. The non-emission region NPXA may surround the emission region PXA. According to some embodiments of the inventive concept, the emission region PXA is defined to correspond to a portion region of the first electrode AE exposed by the opening 70-OP.

An emission layer EL may be located on the first electrode AE. The emission layer EL may be located in a region corresponding to the opening 70-OP. That is, the emission layer EL may be separately formed in each of the pixels. When the emission layer EL is separately formed in each of the pixels, each of the emission layers EL may emit at least one of blue, red, or green color lights. However, embodiments of the inventive concept are not limited thereto, and the emission layer EL may be connected to pixels and provided in common. In this case, the emission layer EL may provide blue light or white light.

A second electrode CE may be located on the emission layer EL. The second electrode CE may have an integrated shape, and may be commonly arranged in or connected to a plurality of pixels.

According to some embodiments, a hole control layer may be located between the first electrode AE and the emission layer EL. The hole control layer may be arranged in common in the emission region PXA and the non-emission region NPXA. The hole control layer may include a hole transport layer, and may further include a hole injection layer. An electronic control layer may be located between the emission layer EL and the second electrode CE. The electronic control layer may include an electron transport layer, and may further include an electron injection layer. The hole control layer and the electronic control layer may be formed in common in a plurality of pixels by using an open mask.

The encapsulating layer 114 may be located on the light emitting element layer 113. The encapsulating layer 114 may include an inorganic layer, an organic layer, and an inorganic layer sequentially stacked, but the layers constituting the encapsulating layer 114 are not limited thereto.

The inorganic layers may protect the light emitting element layer 113 from moisture and oxygen, and the organic layer may protect the light emitting element layer 113 from a foreign material such as a dust particle. The inorganic layers may include a silicon nitride layer, a silicon oxynitride layer, a silicon oxide layer, a titanium oxide layer, an aluminum oxide layer, or the like. The organic layer may include an acrylic organic layer, but embodiments of the inventive concept are not limited thereto.

An input sensor IS may include a base layer 121, a first conductive layer 122, a sensing insulating layer 123, a second conductive layer 124, and a cover insulating layer 125.

The base layer 121 may be an inorganic layer including at least one of silicon nitride, silicon oxynitride, or silicon oxide. Alternatively, the base layer 121 may be an organic layer including epoxy resin, an acrylic resin, or an imide resin. The base layer 121 may have a single layer structure, or may have a multilayer structure stacked along the third direction DR3.

Each of the first conductive layer 122 and the second conductive layer 124 may have a single layer structure, or may have a multilayer structure stacked along the third direction DR3.

The single layered conductive layer may include a metal layer or a transparent conductive layer. The metal layer may include molybdenum, silver, titanium, copper, aluminum, or alloys thereof. The transparent conductive layer may include transparent conductive oxide such as indium tin oxide (ITO), indium zinc oxide (IZO), zinc oxide (ZnO), or indium zinc tin oxide (IZTO). In addition, the transparent conductive layer may include a conductive polymer such as PEDOT, metal nanowire, graphene, etc.

The multilayered conductive layer may include metal layers. The metal layers may have, for example, a three-layer structure of titanium/aluminum/titanium. The multilayered conductive layer may include at least one metal layer and at least one transparent conductive layer.

At least one of a sensing insulating layer 123 or a cover insulating layer 125 may include an inorganic film. The inorganic film may include at least one of aluminum oxide, titanium oxide, silicon oxide, silicon nitride, silicon oxynitride, zirconium oxide, or hafnium oxide.

At least one of the sensing insulating layer 123 or the cover insulating layer 125 may include an organic film. The organic film may include at least one of an acrylic resin, a methacrylic resin, polyisoprene, a vinyl resin, an epoxy resin, an urethane resin, a cellulose resin, a siloxane resin, a polyimide resin, a polyamide resin, or a perylene resin.

Figure 11:
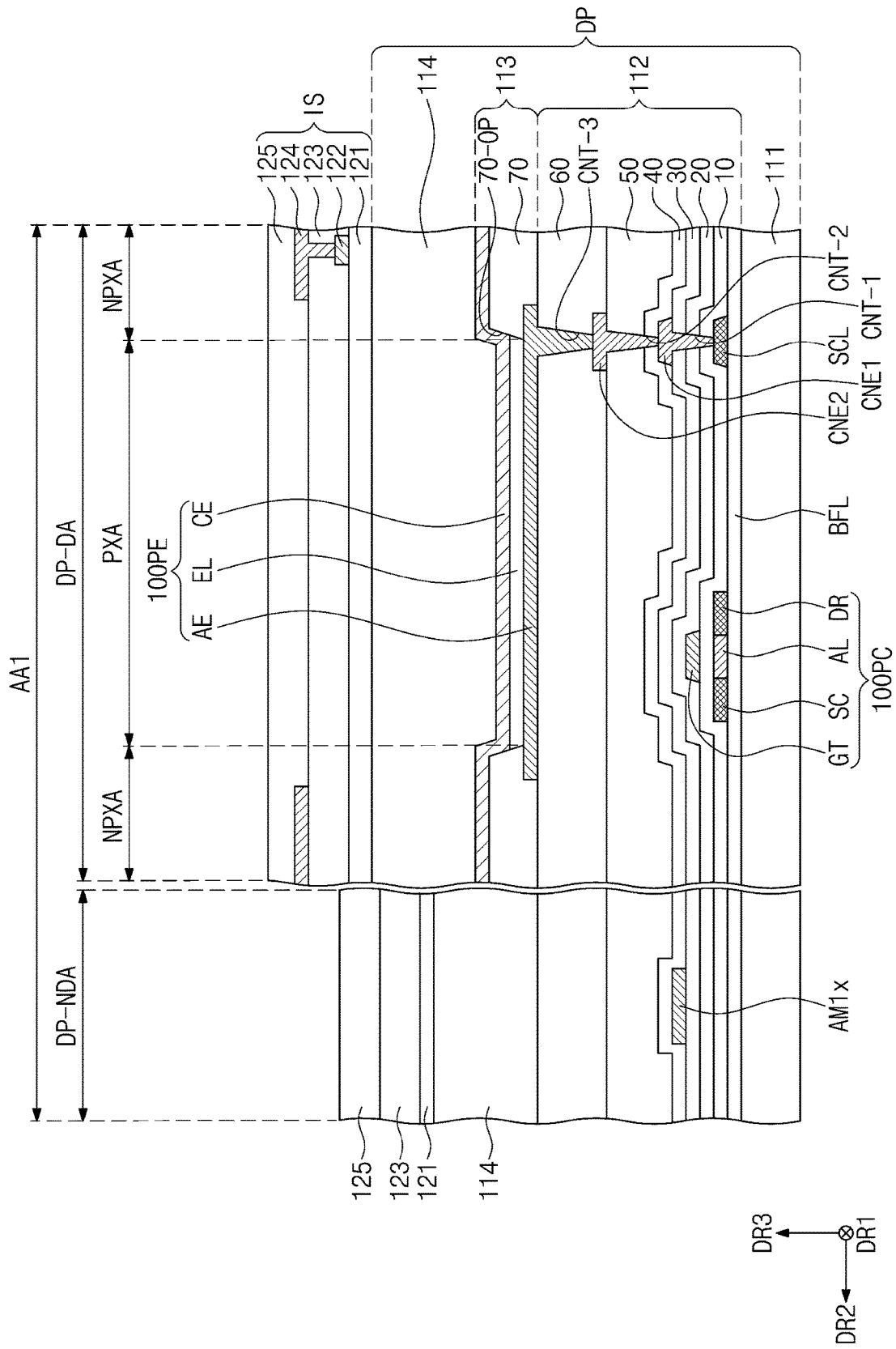
FIG. 11 is a cross-sectional view of a display panel and an input sensor according to some embodiments of the inventive concept.

FIG. 11 is a cross-sectional view of a display panel and an input sensor according to some embodiments of the inventive concept. In the description of FIG. 11, parts that are different from FIG. 10 are described, and components that are the same as those described in FIG. 10 are denoted by the same reference numerals, and descriptions thereof are omitted.

Referring to FIG. 11, a first alignment mark AM1$x$ may be located on a third insulating layer 30. The first alignment mark AM1$x$ may be located on the same layer as a first connection electrode CNE1, and may include the same material as the first connection electrode CNE1. The first alignment mark AM1$x$ may be formed simultaneously through the same process as the first connection electrode CNE1.

Figure 12:
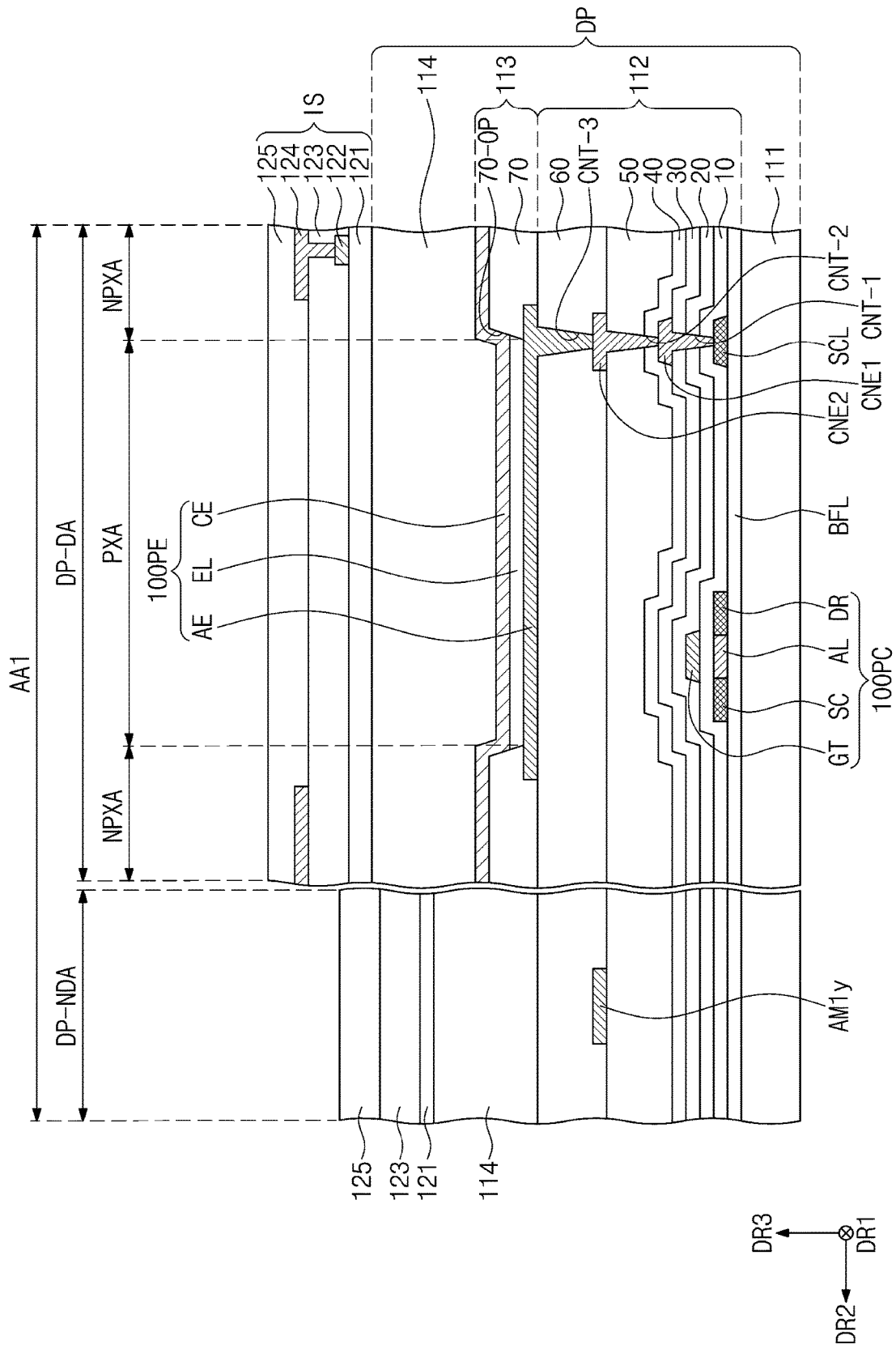
FIG. 12 is a cross-sectional view of a display panel and an input sensor according to some embodiments of the inventive concept.

FIG. 12 is a cross-sectional view of a display panel and an input sensor according to some embodiments of the inventive concept. In the description of FIG. 12, parts that are different from FIG. 10 are described, and components that are the same as those described in FIG. 10 are denoted by the same reference numerals, and descriptions thereof are omitted.

Referring to FIG. 12, a first alignment mark AM1$y$ may be located on a fifth insulating layer 50. The first alignment mark AM1$y$ may be located on the same layer as a second connection electrode CNE2, and may include the same material as the second connection electrode CNE2. The first alignment mark AM1$y$ may be formed simultaneously through the same process as the second connection electrode CNE2.

Figure 13:
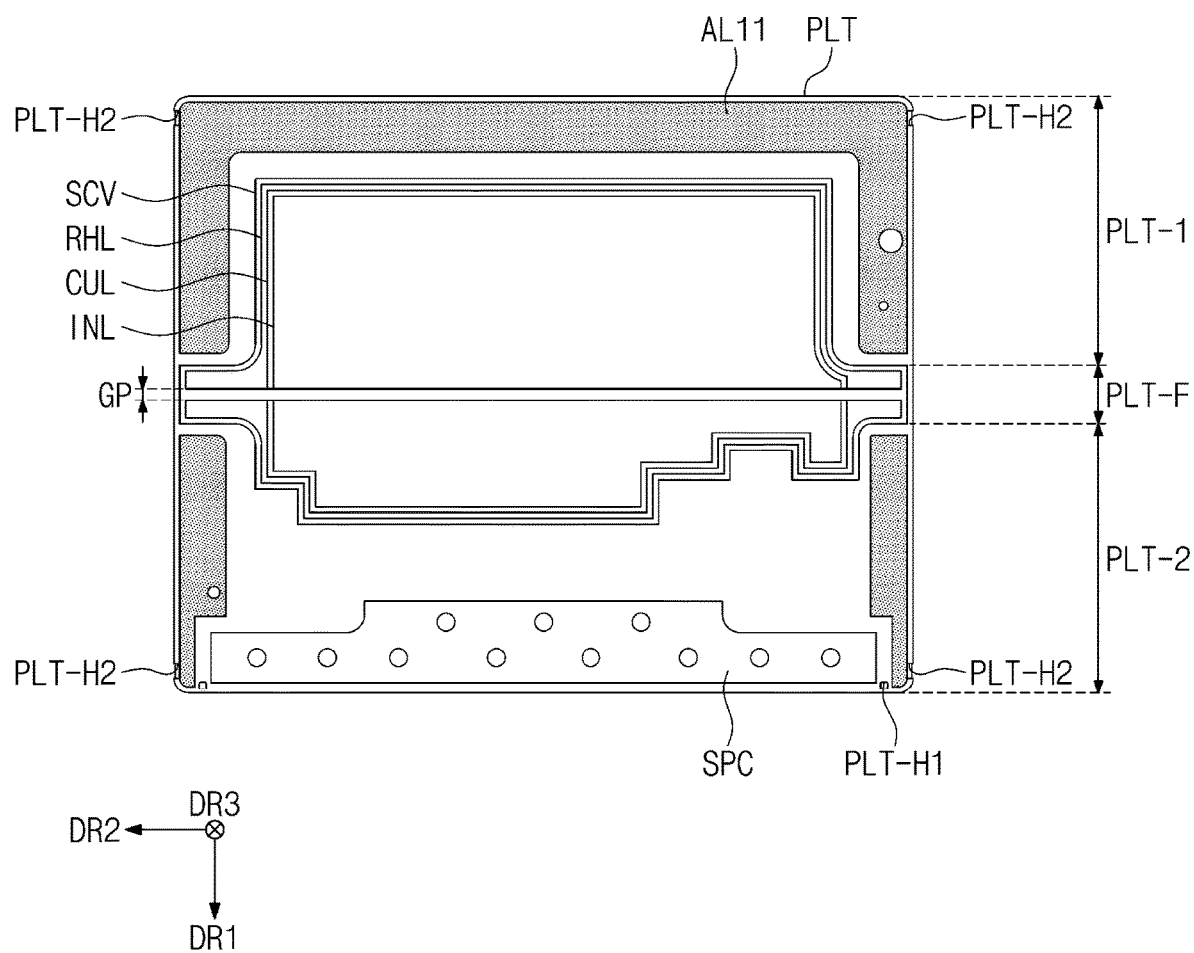
FIG. 13 is a rear view of a display device according to some embodiments of the inventive concept.

FIG. 13 is a rear view of a display device according to some embodiments of the inventive concept. In the description of FIG. 13, parts that are different from FIG. 10 are described, and components that are the same as those described in FIG. 10 are denoted by the same reference numerals, and descriptions thereof are omitted.

FIG. 13 represents the lower surface of a support layer PLT. A cover layer SCV, a heat-radiating layer RHL, a cushion layer CUL, and an insulating layer INL may be sequentially located on the lower surface of the support layer PLT. This stack structure is located in a portion region of the lower surface of the support layer PLT.

The cover layer SCV overlaps a folding region PLT-F. It is illustrated that the areas become smaller toward the cover layer SCV, the heat-radiating layer RHL, the cushion layer CUL, and the insulating layer INL, but embodiments of the inventive concept are not limited thereto. A spacer SPC is arranged to be spared apart from the stack structure. The eleventh adhesive layer AL11 may be located outside the stack structure and may be arranged along the edge of the support layer PLT.

In a region adjacent to a specific edge of a support layer adjacent to a bending region, static electricity may be suddenly discharged, and the frequency of occurrence of phenomena affecting peripheral elements may be more frequent than that of regions adjacent to other edges. According to some embodiments of the inventive concept, an alignment opening adjacent to the specific edge of the support layer may be defined to be spaced apart from the specific edge. In this case, a portion of a display panel exposed by the alignment opening may be spaced apart from the specific edge, even if static electricity is suddenly discharged, the charge may be discharged through the support layer rather than the display panel. Accordingly, the probability that the element included in the display panel is destroyed by electrostatic discharge may be reduced or removed. Therefore, the reliability of the display device may be improved.

Although the exemplary embodiments of the inventive concept have been described herein, it is understood that various changes and modifications can be made by those skilled in the art within the spirit and scope of the inventive concept defined by the following claims or the equivalents. Therefore, the technical scope of the present invention should not be limited to the content described in the detailed description of the specification, but should be determined by the claims and their equivalents.

What is claimed is:

1. A display device comprising:
   a display panel in which a first panel region, a bending region, and a second panel region are arranged along a first direction;
   a support layer below the first panel region of the display panel, wherein the bending region of the display panel is bent toward a lower portion of the support layer;
   a portion of the support layer is between the first panel region and the second panel region;
   a first alignment mark in the first panel region; and
   a first alignment opening overlapping the first alignment mark in the support layer,
   wherein in a thickness direction of the display panel, the first alignment opening is spaced apart from the second panel region,
   the first alignment opening is spaced apart from an edge of the support layer, and
   the first alignment opening is completely surrounded by the support layer.

2. The display device of claim 1, wherein in the thickness direction, the first alignment opening is spaced apart from the second panel region in a second direction intersecting the first direction.

3. The display device of claim 1, wherein the first alignment opening is provided in plurality, and the plurality of first alignment openings are spaced apart with the second panel region therebetween.

4. The display device of claim 3, wherein the first alignment mark is provided in plurality, and the display panel is aligned with the support layer so that the plurality of first alignment marks respectively overlap the plurality of first alignment openings.

5. The display device of claim 1, wherein:
   the support layer comprises a first edge and a second edge which extend along the first direction, and a third edge and a fourth edge which extend along a second direction intersecting the first direction; and
   the bending region is bent while surrounding the fourth edge, and the first alignment opening is closest to the fourth edge among the first to the fourth edges.

6. The display device of claim 5, wherein:
   the display panel further comprises a second alignment mark in the first panel region;
   a second alignment opening overlapping the second alignment mark is defined in the support layer; and
   the second alignment opening is closest to the first edge among the first to the fourth edges.

7. The display device of claim 6, wherein:
   the second alignment opening is spaced apart from the first edge; and
   the second alignment opening is completely surrounded by the support layer.

8. The display device of claim 6, wherein:
   the second alignment opening is connected to the first edge; and
   the first edge and a sidewall defining the second alignment opening are connected to each other.

9. The display device of claim 1, wherein:
   a foldable region is in the first panel region; and
   a plurality of openings are in a region of the support layer overlapping the foldable region.

10. The display device of claim 9, wherein the first alignment opening is spaced apart from the plurality of openings in the first direction.

11. The display device of claim 1, wherein:
    the display panel comprises: a base layer; a circuit layer on the base layer and including a plurality of metal layers; a light emitting element layer on the circuit layer; and an encapsulating layer on the light emitting element layer; and
    the first alignment mark is on a same layer as any one of the plurality of metal layers.

12. The display device of claim 1, wherein a sidewall defining the first alignment opening has a closed curve shape.

13. A display device comprising:
    a display panel in which a first panel region, a bending region, and a second panel region are arranged along a first direction;
    a support layer below the first panel region of the display panel, with the bending region of the display panel being bent toward a lower portion of the support layer;
    a portion of the support layer between the first panel region and the second panel region; and
    a plurality of alignment openings in the support layer,
    wherein a distance of the plurality of alignment openings in a second direction intersecting the first direction is greater than a width of the second panel region in a second direction, and
    each of the plurality of alignment openings is completely surrounded by the support layer.

14. The display device of claim 13, wherein the plurality of alignment openings are spaced apart with the second panel region interposed therebetween.

15. The display device of claim 13, wherein sidewalls respectively defining the plurality of alignment openings are in the support layer, and
    wherein each of the sidewalls has a closed curve shape.

16. The display device of claim 13, wherein the display panel comprises a plurality of alignment marks in the first panel region, and
    the plurality of alignment marks respectively overlap the plurality of alignment openings.

17. The display device of claim 16, wherein:
the display panel further comprises: a base layer; a circuit layer on the base layer and including a plurality of metal layers; a light emitting element layer on the circuit layer; and an encapsulating layer on the light emitting element layer; and
each of the plurality of alignment marks is on a same layer as any one of the plurality of metal layers.

18. The display device of claim 13, wherein:
the plurality of alignment openings are adjacent to an edge of the support layer; and
the bending region of the display panel is bent while surrounding the edge of the support layer.

19. The display device of claim 13, wherein:
a foldable region is in the first panel region; and
a plurality of openings are in a region of the support layer overlapping the foldable region of the display panel.

20. The display device of claim 19, wherein the plurality of alignment openings are spaced apart from the plurality of openings in the first direction.

\* \* \* \* \*